(12) United States Patent
Fujioka

(10) Patent No.: US 10,755,624 B2
(45) Date of Patent: Aug. 25, 2020

(54) DISPLAY DEVICE

(71) Applicant: Japan Display Inc., Tokyo (JP)

(72) Inventor: Takahiro Fujioka, Tokyo (JP)

(73) Assignee: Japan Display Inc., Tokyo (JP)

( * ) Notice: Subject to any disclaimer, the term of this patent is extended or adjusted under 35 U.S.C. 154(b) by 129 days.

(21) Appl. No.: 15/911,771

(22) Filed: Mar. 5, 2018

(65) Prior Publication Data

US 2018/0293936 A1 Oct. 11, 2018

(30) Foreign Application Priority Data

Apr. 6, 2017 (JP) .................................. 2017-075987

(51) Int. Cl.
| | | |
|---|---|---|
| *G09G 3/3208* | (2016.01) | |
| *H01L 51/52* | (2006.01) | |
| *H01L 27/32* | (2006.01) | |
| *G09G 3/3233* | (2016.01) | |

(52) U.S. Cl.
CPC ....... *G09G 3/3208* (2013.01); *H01L 27/3262* (2013.01); *H01L 51/5203* (2013.01); *G09G 3/3233* (2013.01); *G09G 2300/0426* (2013.01); *G09G 2300/0842* (2013.01); *G09G 2310/0264* (2013.01); *G09G 2380/02* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 10,483,293 | B2* | 11/2019 | Miyake | H01L 27/1255 |
| 2012/0062447 | A1* | 3/2012 | Tseng | G02F 1/133305 |
| | | | | 345/33 |
| 2014/0346474 | A1* | 11/2014 | Jeong | H01L 27/32 |
| | | | | 257/40 |
| 2015/0008438 | A1* | 1/2015 | Im | H01L 27/1222 |
| | | | | 257/72 |
| 2016/0095172 | A1* | 3/2016 | Lee | C23C 16/401 |
| | | | | 313/504 |
| 2016/0111037 | A1* | 4/2016 | Kim | G02F 1/13306 |
| | | | | 345/690 |
| 2016/0118616 | A1* | 4/2016 | Hiroki | H01L 51/0097 |
| | | | | 257/40 |
| 2016/0179229 | A1* | 6/2016 | Ahn | G06F 3/041 |
| | | | | 345/173 |
| 2017/0365234 | A1* | 12/2017 | Yamazaki | G09G 3/20 |
| 2018/0033843 | A1* | 2/2018 | Liu | G02F 1/133305 |
| 2018/0175131 | A1* | 6/2018 | Lee | H01L 27/3276 |
| 2019/0006449 | A1* | 1/2019 | Wu | H01L 51/0097 |
| 2019/0073946 | A1* | 3/2019 | Su | H01L 51/5221 |

(Continued)

FOREIGN PATENT DOCUMENTS

JP 2008-111890 A 5/2008

*Primary Examiner* — Chad M Dicke
(74) *Attorney, Agent, or Firm* — Michael Best & Friedrich LLP

(57) ABSTRACT

A display device includes a display region including a first region and a second region adjacent to the first region; a plurality of display elements arrayed in a first direction and a second direction crossing the first direction in the display region; and transistors electrically connected with the plurality of display elements. The first region is a curved region extending in the second direction, and the transistors are located outer to the first region.

15 Claims, 23 Drawing Sheets

(56) References Cited

U.S. PATENT DOCUMENTS

2019/0340969 A1* 11/2019 Hu ........................ G09G 3/20
2019/0347999 A1* 11/2019 Kim .................... G09G 3/3275
2019/0355760 A1* 11/2019 Takahashi .......... H01L 27/1262

* cited by examiner

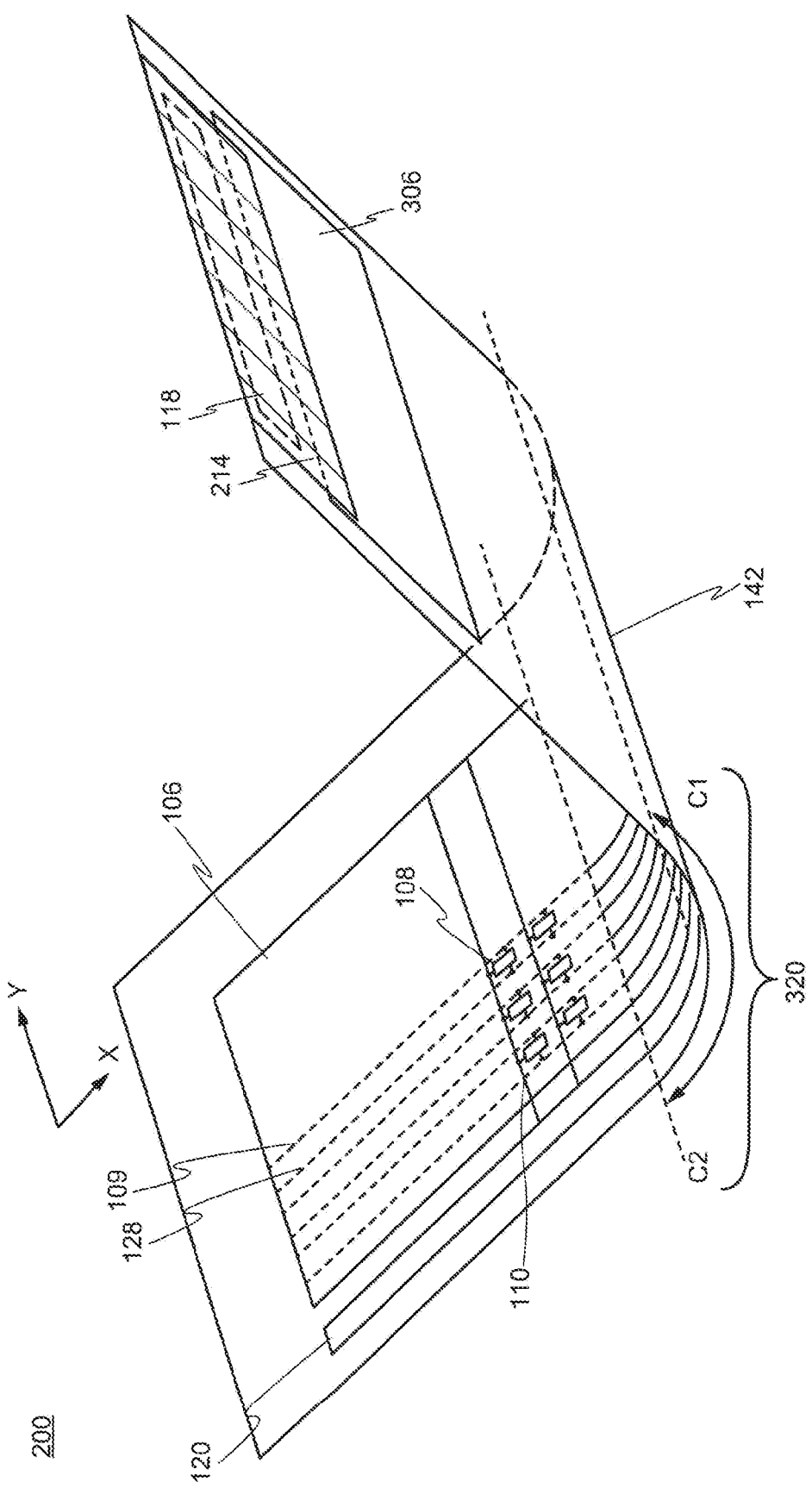

DISPLAY DEVICE

CROSS REFERENCE TO RELATED APPLICATIONS

This application is based upon and claims the benefit of priority from the prior Japanese Patent Application No. 2017-075987, filed on Apr. 6, 2017, the entire contents of which are incorporated herein by reference.

FIELD

An embodiment of the present invention relates to a display device, for example, a flexible display device.

BACKGROUND

A liquid crystal display device or an organic electroluminescence display device (hereinafter, referred to as an "organic EL display device") includes a plurality of pixels each including a display element such as a liquid crystal element or a light emitting element, and provides an image by controlling the driving of each of the pixels.

The organic EL display device includes a plurality of pixels provided on a substrate, and the plurality of pixels each include a plurality of transistors and an organic light emitting element (hereinafter, referred to as a "light emitting element"). The light emitting element include a pair of electrodes and a layer containing an organic compound. The layer is provided between the pair of electrodes. The light emitting element is a self-light emitting element that is driven by an electric current provided between the pair of electrodes. The supply of the electric current to the light emitting element is controlled by the transistors, and thus the display device displays a video. Such an EL display device is suitable as a flexible and thin display device because, for example, the light emitting element included in the organic EL display device has a stack structure including thin organic films, and the organic EL display device does not need a backlight unit. Using these features of the organic EL display device, a so-called flexible display (sheet display) including a flexible substrate and a light emitting element provided thereon is now produced. For example, Japanese Laid-Open Patent Publication No. 2008-111890 discloses a flexible organic EL display device having a structure in which the size of, the pitch between, pixels are varied in order to suppress distortion of the screen when the flexible organic EL display device is folded.

SUMMARY

An embodiment of the present invention is directed to a display device including a display region including a first region and a second region adjacent to the first region; a plurality of display elements arrayed in a first direction and a second direction crossing the first direction in the display region; and transistors electrically connected with the plurality of display elements. The first region is a curved region extending in the second direction, and the transistors are located outer to the first region.

BRIEF DESCRIPTION OF DRAWINGS

FIG. 23 is a schematic perspective view of the display device in an embodiment according to the present invention.

DESCRIPTION OF EMBODIMENTS

Figure 1:
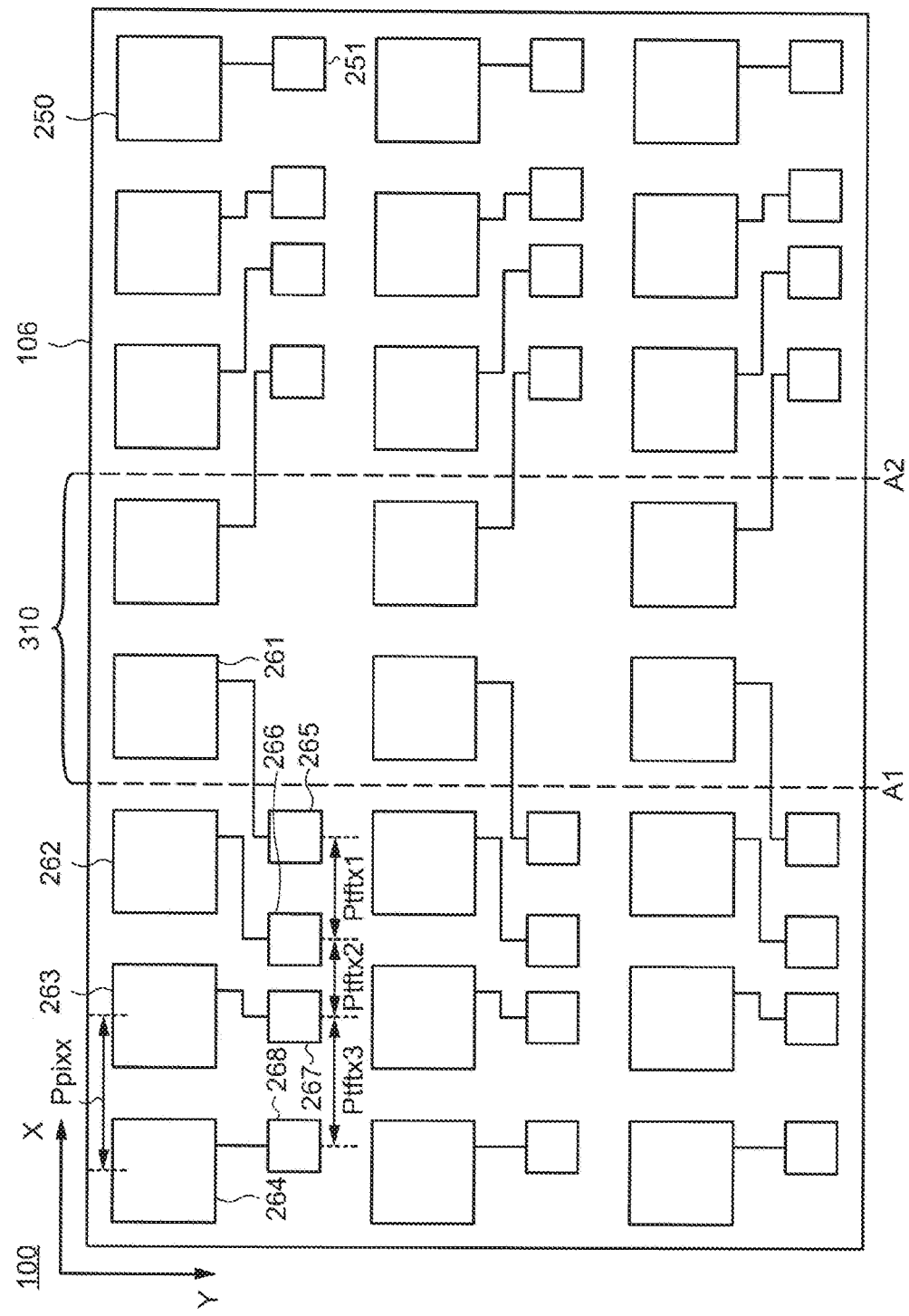
FIG. 1 is a schematic plan view of a display region included in a display device in an embodiment according to the present invention.

Hereinafter, embodiments of the present invention will be described with reference to the drawings and the like. An embodiment of the present invention. present invention may be carried out in various forms, and is not to be construed as being limited to any of the following embodiments. In the drawings, components may be shown schematically regarding the width, thickness, shape and the like, instead of being shown in accordance with the actual sizes, for the sake of clearer illustration. The drawings are merely examples and do not limit the interpretations of an embodiment of the present invention in any way. In the specification and the drawings, components that have substantially the same functions as those described before with reference to a previous drawing(s) bear the identical reference signs thereto (or the identical reference signs with "a", "b" or the like after the signs), and detailed descriptions thereof may be omitted. The terms "first", "second" or the like provided for each of the components are used for the sake of convenience in order to distinguish the components, and do not have any other significance unless otherwise specified.

In this specification, an expression that a component is "on" (or "above" or "below") another component encompasses a case where such a component is in contact with the another component and also a case where such a component is above or below the another component, namely, a case where still another component is provided between such a component and the another component, unless otherwise specified. In the following description, regarding a cross-sectional view, the side on which a second substrate is provided with respect to a first substrate will be referred to as "above", and the opposite side will be referred to as "below" unless otherwise specified.

In this specification, the first substrate includes at least one planar main surface, and layers including an insulating layer, a semiconductor layer and a conductive layer or elements including a transistor, a display element and the like are provided on the one main surface. In the following description, regarding a cross-sectional view, the one surface of the first substrate will be used as the reference. Unless otherwise specified, the terms "upper layer", "above" and "upper surface" used regarding the first substrate will be used with respect to the one main surface of the first substrate.

A flexible display has a structure including a plurality of stacked films. The films are formed of an inorganic compound. The flexible display includes a plurality of transistors each formed of a plurality of films. An inorganic compound is hard, and the transistors are covered with the inorganic compound. As the flexible display is folded repeatedly, the films of the inorganic compound and the transistors are gradually damaged. As such damage on the inorganic compound films and the transistors become serious, the functions of the flexible display are spoiled in the end; for example, the inorganic compound films are broken or the transistors are made difficult to be driven.

In light of such problems, an embodiment of the present invention has an object of providing a flexible display device, for example, a flexible organic EL display device. An embodiment of the present invention has an object of providing a highly reliable flexible display device.

Embodiment 1

In this embodiment, a structure of a display device, specifically, a structure of a flexible display device that suppresses damage and loss of functions that are caused by the display device being folded repeatedly will be described. More specifically, the following will be described regarding a flexible display device: a curved region and a display region included in the display device, and a positional arrangement and locations of display elements and transistors included in pixels included in the display region.

1-1. Overall Structure

FIG. 1 is a schematic plan view of a display region 106 included in a display device 100 in an embodiment according to the present invention.

The display device 100 includes the display region 106, and a region overlapping the display region 106 and sandwiched between line A1 and line A2 extending in a direction crossing a first direction (represented by "X" in FIG. 1) (such a region will be referred to as a "curved region 310"). The display region 106 includes a plurality of display elements 250 arrayed in the first direction and a second direction (represented by "Y" in FIG. 1) crossing the first direction. A display element 261, a display element 262, a display element 263 and a display element 264 are examples of the display elements 250. In FIG. 1, the display elements 250, the display element 261, the display element 262, the display element 263, the display element 264, a transistor 251, a transistor 265, a transistor 266, a transistor 267 and a transistor 268 are shown as being on the same plane for the easier understanding. In actuality, however, the display elements 250, the display element 261, the display element 262, the display element 263 and the display element 264 are located in a layer upper to the transistors. The transistor 265, the transistor 266, the transistor 267 and the transistor 268 are examples of the transistors 251.

The curved region 310 included in the display device 100 is foldable. Therefore, the display device 100 is flexible. The curved region 310 included in the display device 100 is sandwiched between line A1 and line A2, which are dashed lines in FIG. 1. The curved region may be entirely foldable or partially foldable.

The transistor 251, the transistor 265, the transistor 266, the transistor 267 and the transistor 268 are located outer to the curved region 310. Namely, in the curved region 310, the display element 261 is located. In the display region 106 outer to the curved region 310, the transistor 251, the transistor 265, the transistor 266, the transistor 267 and the transistor 268 are located.

The display device 100 includes the first transistor 265 electrically connected with the first display element 261 included in the curved region 310, the second transistor 266 electrically connected with the second display element 262 located outer to the curved region 310 and adjacent to the first display element 261, the third transistor 267 electrically connected with the third display element 263 adjacent to the second display element 262, and the fourth transistor 268 electrically connected with the fourth display element 264 adjacent to the third display element 263. The pitch between the display elements is labeled as Ppixx. The pitch between the first transistor 265 and the second transistor 266 is labeled as Ptftx1. The pitch between the second transistor 266 and the third transistor 267 is labeled as Ptftx2. The pitch between the third transistor 267 and the fourth transistor 268 is labeled as Ptftx3.

The pitches between the transistors will be described. Regarding each of the transistors, a region where a semiconductor layer and a gate electrode overlap each other is set as the center of the transistor. Herein, the pitch between the transistors is the length between the centers of two adjacent transistors. The same is applicable to a case where there are a plurality of gate electrodes. For example, in the case where there are two gate electrodes, the center of one of the gate electrodes is used to define the center of the transistor. Similarly, the pitch between the display elements is the length between the centers of two adjacent display elements.

The pitch between the display elements is equal for all the display elements. The pitch Ptftx1 between the first transistor 265 and the second transistor 266, the pitch Ptftx2 between the second transistor 266 and the third transistor 267, and the pitch Ptftx3 between the third transistor 267 and the fourth transistor 268 are each shorter than, or equal to, the pitch Ppixx between the display elements. Namely, the sum of the pitches between the transistors is shorter than, or equal to, the sum of the pitches between the display elements. The pitches between the transistors may each be equal to, or shorter than, the pitch between the display elements.

In FIG. 1, the pitch Ptftx1 between the first transistor 265 and the second transistor 266, the pitch Ptftx2 between the second transistor 266 and the third transistor 267, and the pitch Ptftx3 between the third transistor 267 and the fourth transistor 268 are shown as being different from each other. Alternatively, the pitches between the transistors may be equal to each other. Still alternatively, there may be transistors, the pitches between which are equal to each other, and there may be transistors, the pitches between which are different from each other. In FIG. 1, the pitch Ptftx1 between the first transistor 265 and the second transistor 266 is shorter than the pitch Ptftx3 between the third transistor 267 and the fourth transistor 268, and the pitch Ptftx2 between the second transistor 266 and the third transistor 267 is shorter than the pitch Ptftx1 between the first transistor 265 and the second transistor 266. The length relationship among the pitches is not limited to that shown in FIG. 1. The pitch Ptftx1 between the first transistor 265 and the second transistor 266 may be longer than the pitch Ptftx3 between the third transistor 267 and the fourth transistor 268, and the pitch Ptftx2 between the second transistor 266 and the third transistor 267 may be longer than the pitch Ptftx1 between the first transistor 265 and the second transistor 266. A structure in which the pitches between the transistors are different from each other, or a structure in which there are transistors, the pitches between which are equal to each other and also there are transistors, the pitches between which are different from each other, improves the freedom of positional arrangement of the transistors. By contrast, in the case where the pitches between the transistors are equal to each other, the layout is made easier.

In FIG. 1, the transistors are located close to the curved region 310 (close to line A1 and close to line A2). Alternatively, the transistors may be located far from the curved region 310 (far from line A1 and far from line A2). Still alternatively, the transistors may be far from both of the curved region and ends of the display region. Namely, the transistors may be located in any manner as long as the transistors are located outer to the curved region 310 and are electrically connected with the corresponding display elements. As long as the pitches between the transistors are shorter than the pitch between the display elements, the freedom of positional arrangement of the transistors is improved.

With the above-described positional arrangement and locations, the transistors are not located in the curved region. Therefore, damage on the transistors or defects such as cracks or the like caused by the folding operation is suppressed. Thus, the resultant display device is highly reliable and highly flexible. In addition, decline in the display quality such that the electric current is not supplied to the display elements, which would be caused by the damage on the transistors, is suppressed.

Figure 2:
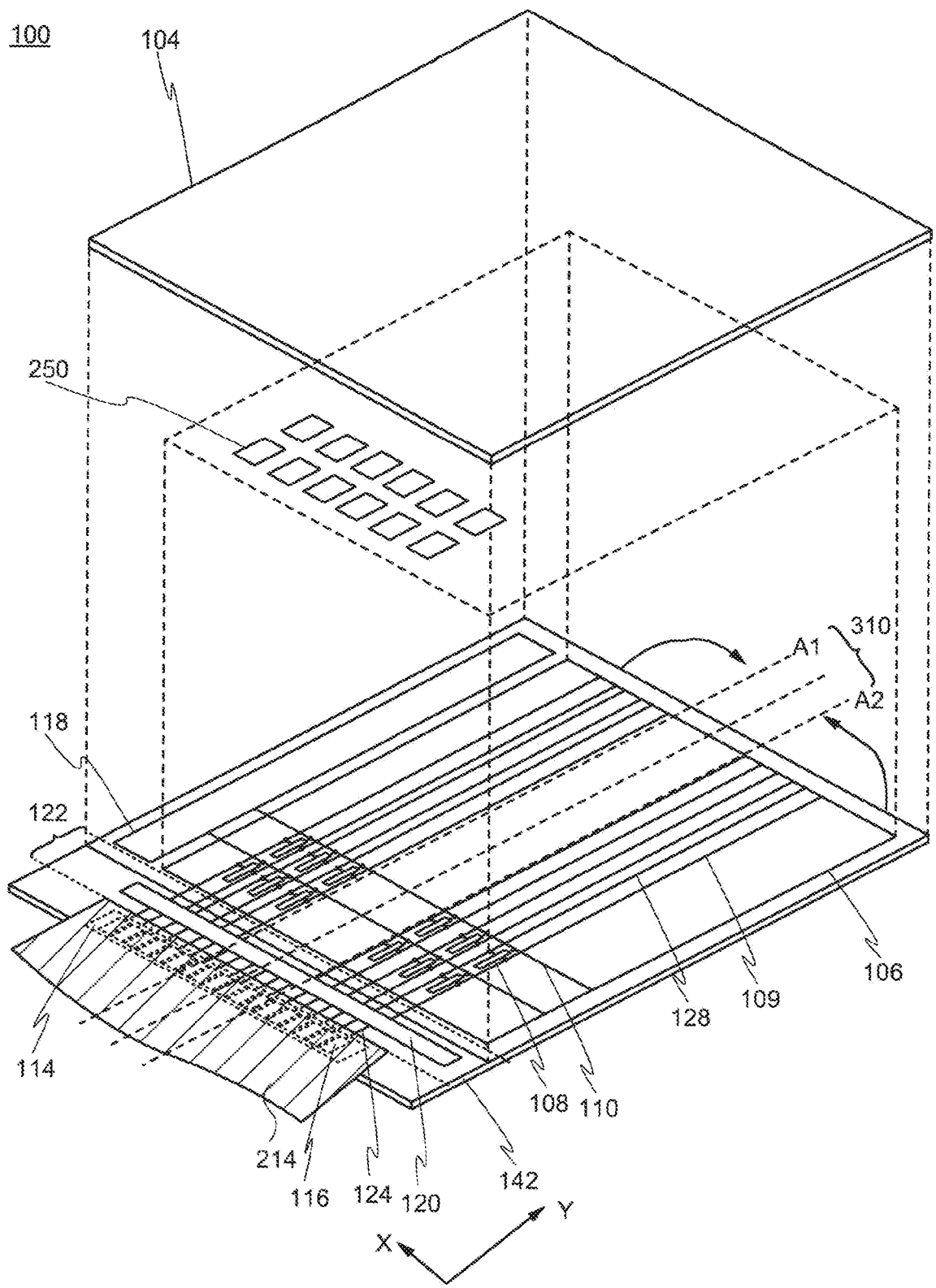
FIG. 2 is a schematic perspective view of the display device in an embodiment according to the present invention.

FIG. 2 is a schematic perspective view of the display device 100 in an embodiment according to the present invention. For easier understanding, in FIG. 2, a front surface barrier film 104, a layer of the display elements 250, portions 108 including components of pixel circuits PX (not shown) other than the display elements and the like of the display device 100 are shown as being separated from each other. There are layers not shown between the shown layers. The plurality of pixel circuits PX (not shown) included in the display region 106 each include the display element 250 and at least one transistor. The display element 250 and the at least one transistor are electrically connected to each other via an intermediate wire (described below with reference to FIG. 8 to FIG. 10). The display elements 250 and the portions 108 including the components other than the display elements are at least partially overlap each other. The display elements 250 and the portions 108 including the components other than the display elements may not overlap each other at all. The portions 108 including the components other than the display elements each include at least a transistor and a capacitance. The intermediate wire is included in both of the display element 250 and the portion 108 including the components other than the display element in order to electrically connect the display element 250 and the at least one transistor. Here, the front surface barrier film 104 is the second substrate.

The display device 100 includes a base film 142. On one surface (upper surface) of the base film 142, a structural body including a stack of various patterned insulating films, a conductive film and a semiconductor film (hereinafter, such a structural body will be referred to as a "functional layer") and a video signal line driving circuit 120 are located. The functional layer includes the display region 106 including the plurality of pixel circuits PX extending in the first direction and the second direction crossing the first direction, a scanning signal line driving circuit 118 located in a peripheral region enclosing the display region 106, and the like. The video signal line driving circuit 120 is also located in the peripheral region enclosing the display region 106. The portions 108 including the components of the plurality of pixel circuits PX other than the display elements may each be electrically connected with a video signal line 109, a scanning signal line 110 and a driving power supply line 128. The display region 106 and the scanning signal line driving circuit 118 are provided between the base film 142 and the front surface barrier film 104. The video signal line driving circuit 120 may be provided between the base film 142 and the front surface barrier film 104. Various signals from an external circuit (not shown) are input to the scanning signal line driving circuit 118 or the video signal line driving circuit 120 via a connector 214 such as a flexible printed circuit (FPC) or the like connected with a terminal region 114 including a plurality of electrode terminals 116 provided on the base film 142. Based on these signals, each of the pixel circuits PX is controlled. Here, the base film 142 is the first substrate.

The display device 100 is flexible and is foldable along the curved region 310. The transistors connected with the display elements 250 are located outer to the curved region 310 and the display region 106 overlap each other. The curved region 310 includes the intermediate wires (described below with reference to FIG. 8 to FIG. 10) electrically connecting the display elements 250 and the transistors to each other, and a plurality of the scanning signal lines 110.

Figure 3:
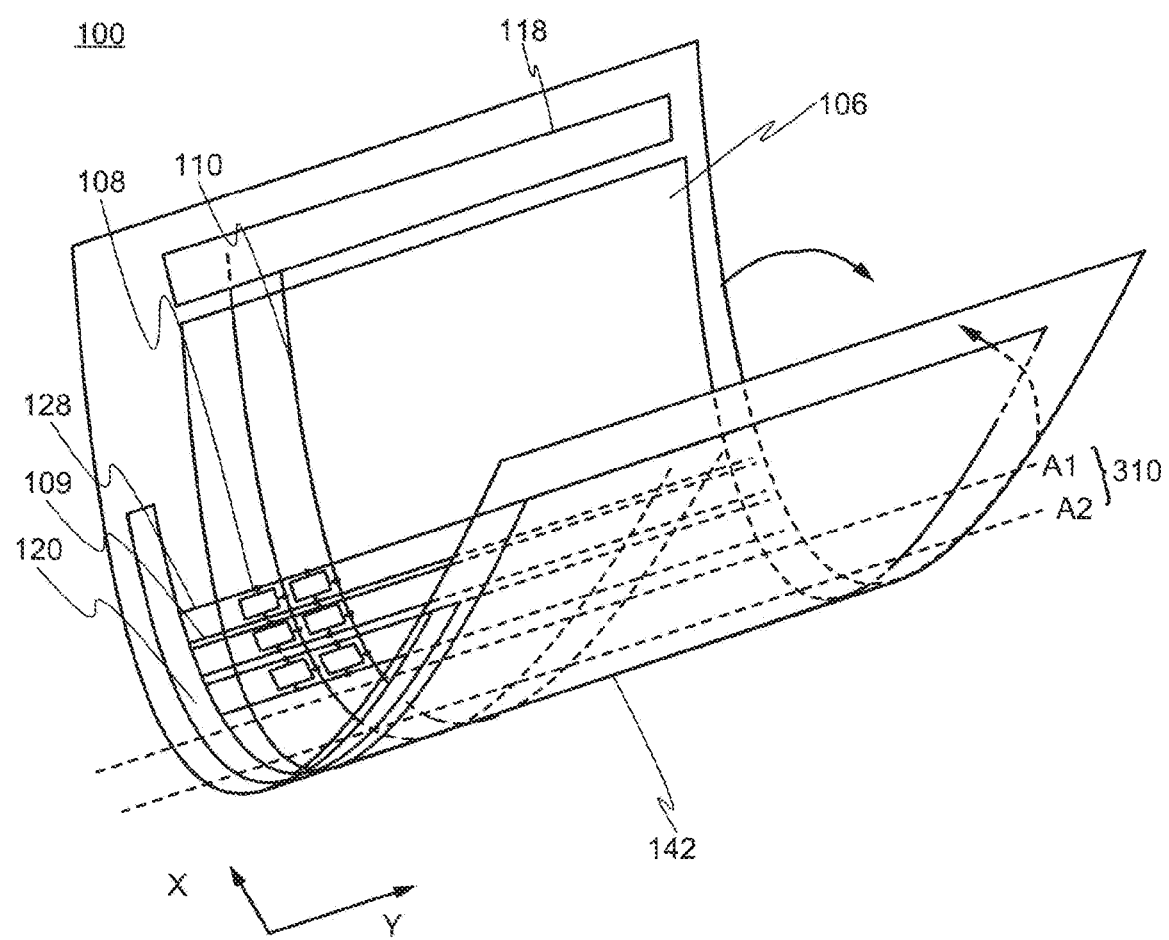
FIG. 3 is a schematic perspective view of the display device in an embodiment according to the present invention.
Figure 4:
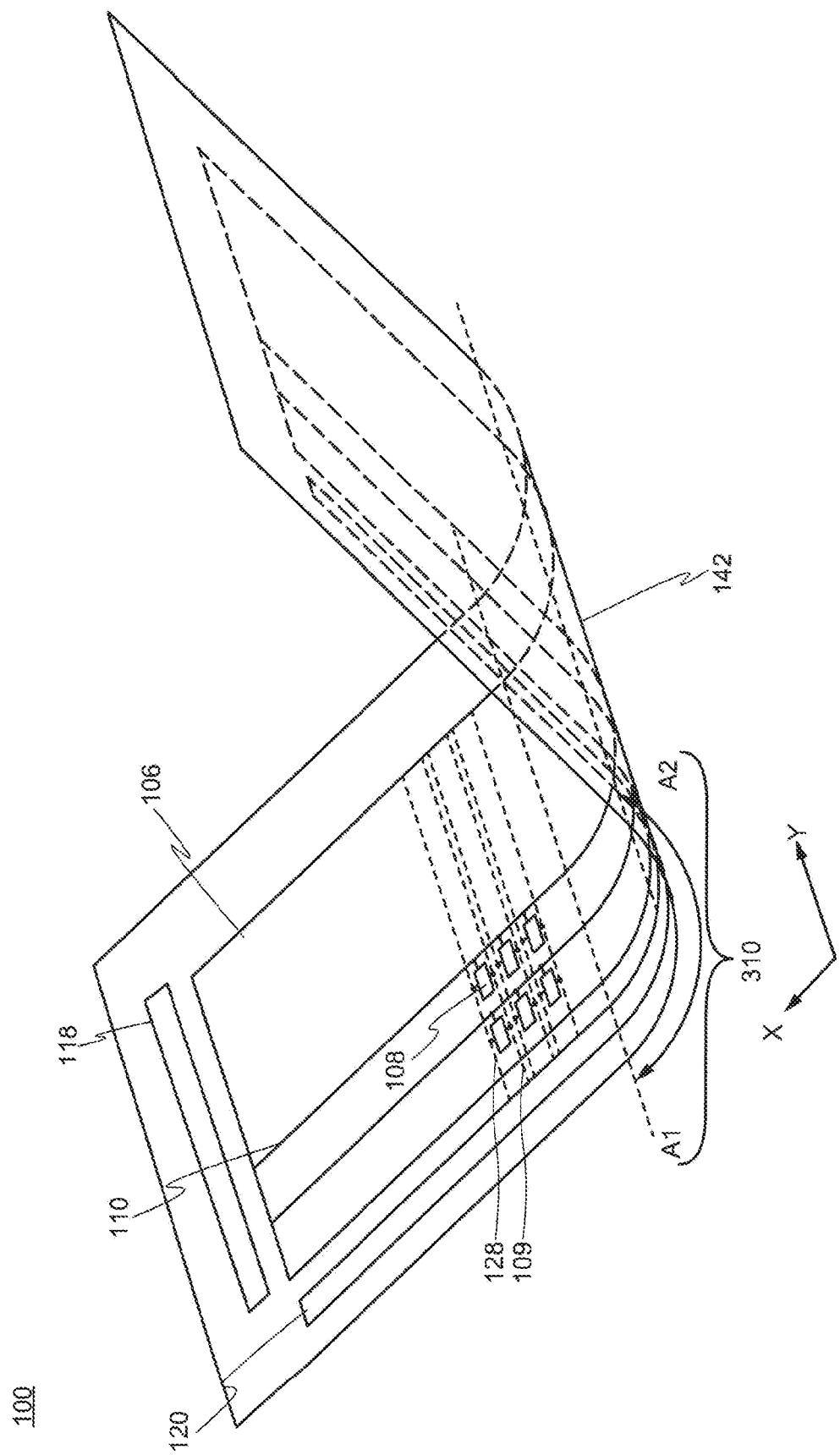
FIG. 4 is a schematic perspective view of the display device in an embodiment according to the present invention.

FIG. 3 and FIG. 4 are each a schematic perspective view showing the display device 100 shown in FIG. 1 and FIG. 2 in a state of being folded along the curved region 310. The curved region 310 may be entirely foldable mildly as shown in FIG. 3 or may be partially foldable as shown in FIG. 4.

The plurality of pixel circuits PX may each include the display element 250 such as a light emitting element, a liquid crystal element or the like. For example, the display elements 250 corresponding to so-called RGB three primary colors of red (R), green (G) and blue (B) may be respectively provided in three pixels, so that the three pixels may form one main pixel. The three pixels may be each provided with a 256-stage voltage or current, so that the display device 100 provide full-color display. Alternatively, the display elements 250 corresponding to red, green, blue and white or yellow may be respectively provided in four pixels, so that the four pixels may form one main pixel. There is no specific limitation on the positional arrangement of the plurality of pixel circuits PX or the positional arrangement of the portions 108 including the components of the plurality of pixel circuits PX other than the display elements. A stripe arrangement or a delta arrangement may be adopted. In the display device 100 in an embodiment according to the present invention, the display elements 250 each include a light emitting element 136, and the stripe arrangement is adopted.

Figure 5:
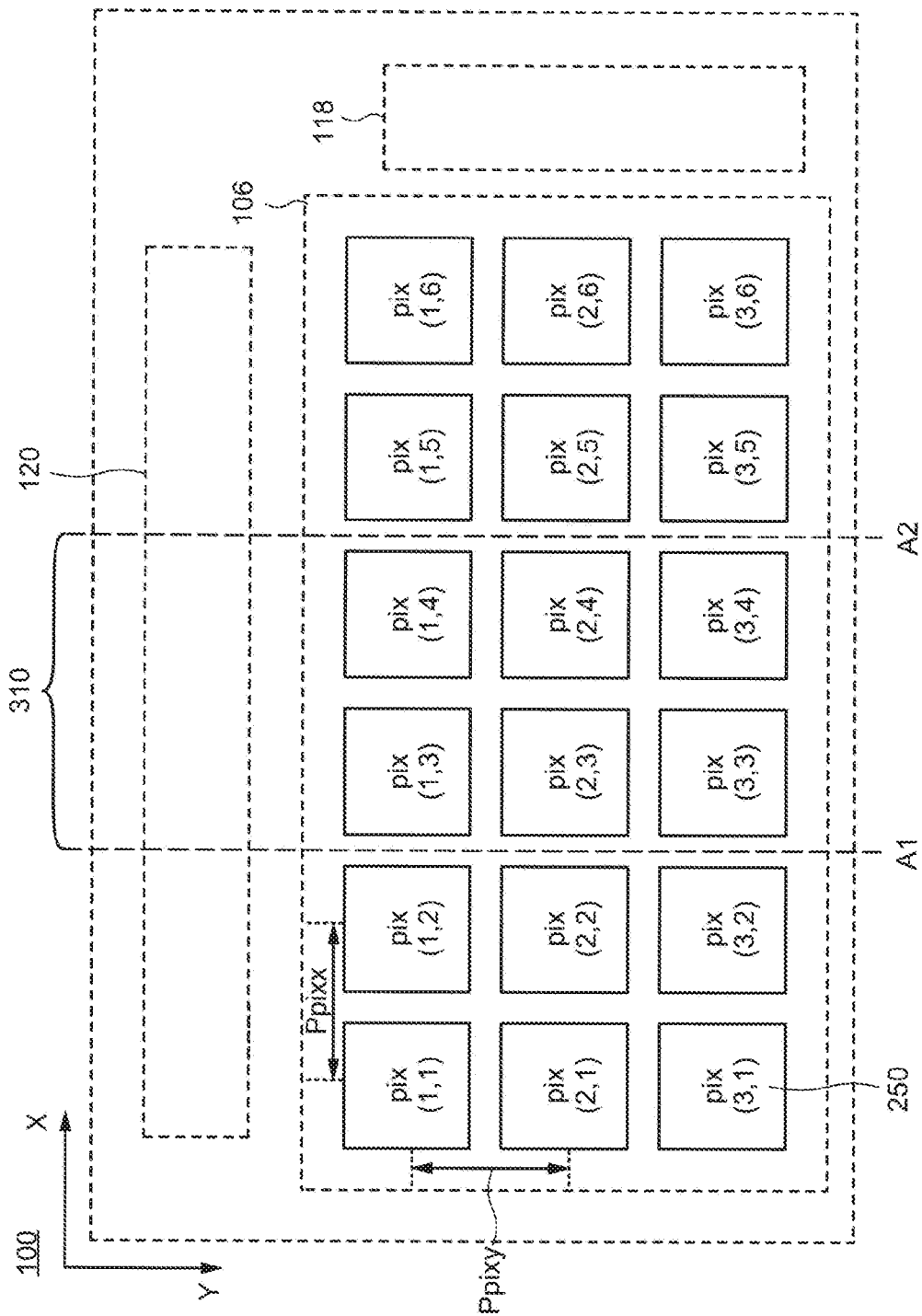
FIG. 5 is a schematic plan view showing a structure of the display device in an embodiment according to the present invention.

FIG. 5 is a schematic view showing a positional arrangement of the display elements 250 included in the pixel circuits PX (m, n) (not shown) in the display region 106 included in the display device 100. In the display region 106, the display elements 250 are arrayed in the first direction and the second direction crossing the first direction. The number of the display elements 250 is optional. For example, m pieces of display elements 250 are located in an X direction, and n pieces of display elements 250 are located in a Y direction. m and n are independently a natural number larger than 1. In the display device in an embodiment according to the present invention, the X direction is parallel to the direction in which the scanning signal line extends, and the Y direction is parallel to the direction in which the video signal line extends. In the display device in an embodiment according to the present invention, the X direction will be referred to as a "row direction", and the Y direction will be referred to as a "column direction". In the following description, the positional arrangement of the plurality of pixel circuits PX will be described by way of an example in which the pixel circuits PX are located in 3 rows by 6 columns. For example, the display element 250 included in the pixel circuit PX located at row 2 and column 3 is represented as "pix (2, 3)". The pitch in the X direction between the display elements 250 is labeled as Ppixx, and the pitch in the Y direction between the display elements 250 is labeled as Ppixy. The region sandwiched between line A1 and line A2 is the curved region 310, which is foldable. The display elements 250 may be located in the curved region 310.

Figure 6:
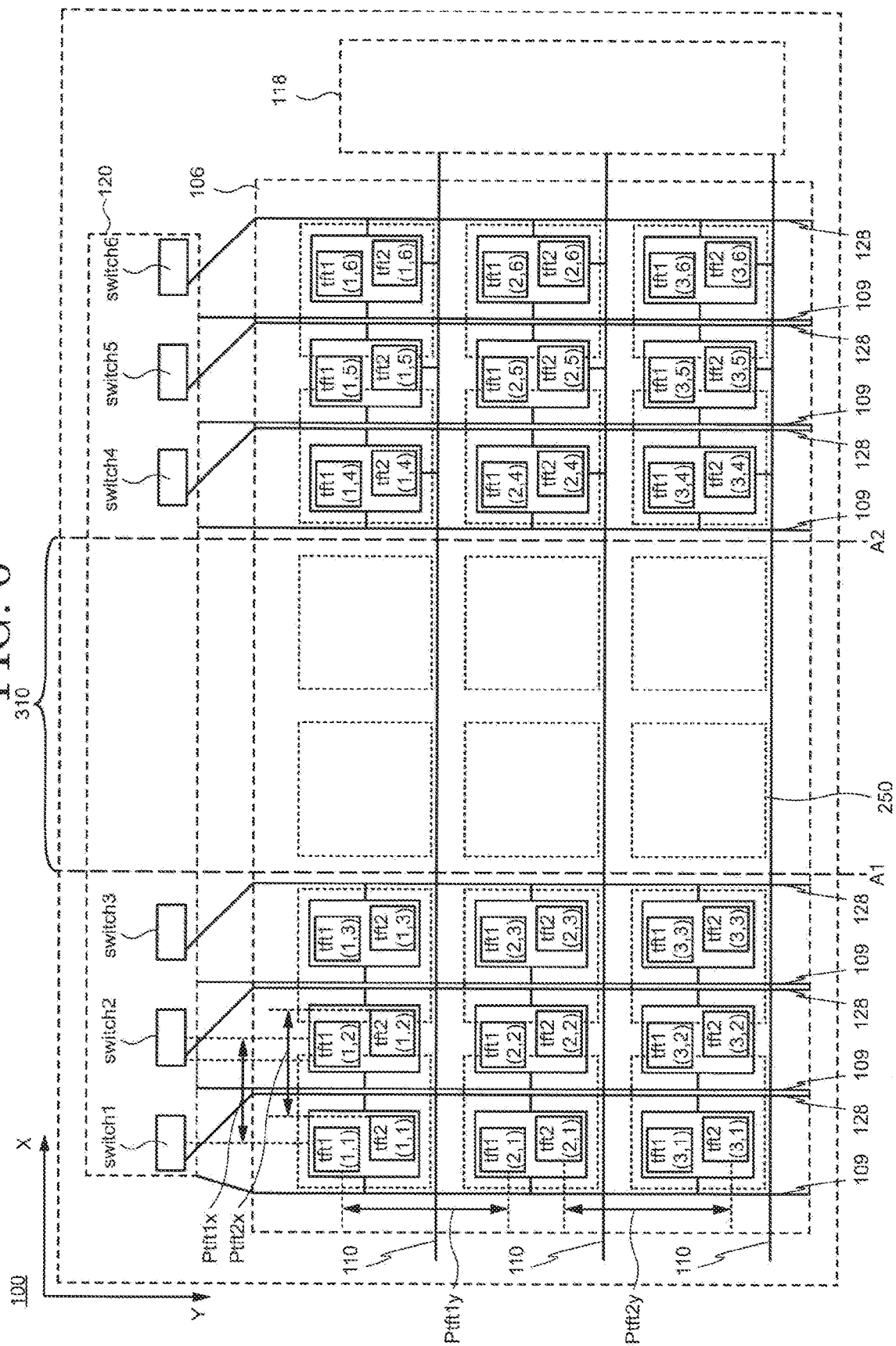
FIG. 6 is a schematic plan view showing the structure of the display device in an embodiment according to the present invention.

FIG. 6 is a schematic view showing a positional arrangement of the transistors included in the pixel circuits (m, n) (not shown) in the display region 106 included in the display device 100. The pixel circuits PX each include at least one transistor. The components same as those in FIG. 5 may not be described. The transistors are electrically connected with the display elements 250 via the intermediate wires (described below with reference to FIG. 8 to FIG. 10). In the display region 106, the plurality of scanning signal lines 110 extend parallel to the X direction, and a plurality of the video signal lines 109 and a plurality of the driving power supply lines 128 extend parallel to the Y direction. FIG. 6 shows an example in which the pixel circuits PX each include a transistor tft1 and a transistor tft2. For example, the transistor tft1 included in the pixel circuit PX (2, 3) located at row 2 and column 3 is represented as "tft1 (2, 3)", and the transistor tft2 included in the pixel circuit PX located at row 2 and column 3 is represented as "tft2 (2, 3)". In order to show the positional relationship between the transistors and the display elements 250, the display elements 250 are shown with dotted lines. The pitch in the X direction between the transistors ftf1 is labeled as Pftf1$x$, and the pitch in the Y direction between the transistors tft1 is labeled as Pftf1$y$. The pitch in the X direction between the transistors ftf2 is labeled as Pftf2$x$, and the pitch in the Y direction between the transistors tft2 is labeled as Pftf2$y$. The region sandwiched between line A1 and line A2 is the curved region 310, which is foldable. The transistors are located outer to the curved region 310.

The at least one transistor shown in FIG. 6 is electrically connected with the display element 250 shown in FIG. 5 via the intermediate wire (described below with reference to FIG. 8 to FIG. 10). For example, it is now assumed that the display element 250 is electrically connected with the transistor tft1. The intermediate wires may be included in the curved region 310 and the display region 106. Specifically, referring to FIG. 6, the intermediate wire connecting the display element pix (1, 3) and the transistor tft1 (1, 3) included in the pixel circuit PX (1, 3) to each other, the intermediate wire connecting the display element pix (1, 4) and the transistor tft1 (1, 4) included in the pixel circuit PX (1, 4) to each other, the intermediate wire connecting the display element pix (2, 3) and the transistor tft1 (2, 3) included in the pixel circuit PX (2, 3) to each other, the intermediate wire connecting the display element pix (2, 4) and the transistor tft1 (2, 4) included in the pixel circuit PX (2, 4) to each other, the intermediate wire connecting the display element pix (3, 3) and the transistor tft1 (3, 3) included in the pixel circuit PX (3, 3) to each other, and the intermediate wire connecting the display element pix (3, 4) and the transistor tft1 (3, 4) included in the pixel circuit PX (3, 4) to each other, are included in the curved region 310.

In this embodiment, the display elements 250 included in the display region 106 are described by way of an example in which the display elements 250 are located in 3 rows by 6 columns. In the positional arrangement of the display elements 250 and the transistors, 6 times the pitch Ppixx, at which the display elements 250 are located in the X direction, is longer than 6 times the pitch Pftf1$x$, at which the transistors ftf1 are located in the X direction. In addition, the transistors ftf1 and the transistors tft2 are located outer to the curved region 310.

In this embodiment, the display elements 250 are described by way of an example in which the display elements 250 are located in 3 rows by 6 columns. In the case where the display elements 250 are located in m rows by n columns, m times the pitch Ppixx, at which the display elements 250 are located in the X direction, is longer than m times the pitch Ptft1$x$, at which the transistors tft1 are located in the X direction. In addition, the transistors ftf1 and the transistors tft2 are located outer to the curved region 310. Herein, m is a natural number larger than 1.

The positional arrangement of the display elements 250 and the transistors is described above by way of the arrangement in the X direction. The above-described positional arrangement is applicable the Y direction. In the case where the above-described positional arrangement is applied to the Y direction, the curved region 310 extends parallel to the X direction. The conditions on the positional arrangement of the display elements 250 and the transistors in the case where the above-described positional arrangement is applied to the Y direction will be described by way of an example in which the display elements 250 are located in m rows by n columns. In the positional arrangement of the display elements 250 and the transistors, m times the pitch Ppixy, by which the display elements 250 are located in the Y direction, is longer than m times the pitch Pftft1y, by which the transistors ftf1 are located in the Y direction. In addition, the transistors ftf1 and the transistors tft2 are located outer to the curved region 310. Herein, m is a natural number larger than 1.

In the above description, the pixel circuits PX each include two transistors, namely, the transistor ftf1 and the transistor tft2. The number of the transistors is not limited to 2. The number of the transistors included in each pixel circuit PX may be any number with which the transistors are located outer to the curved region 310. In the case where the number of the transistors included in each pixel circuit is larger, for example, the current value supplied to the display elements 250 is corrected and thus a higher quality image is provided.

In the above description, there is one curved region. Alternatively, there are two or more curved regions. In the case where a plurality of curved regions are provided, the display device may be, for example, folded in three, and thus is decreased in size.

In the case where the scanning signal line driving circuit 118 or the video signal line driving circuit 120 includes a circuit such as a shift register or the like, the pitch between such circuits is matched to the pitch between the transistors. For example, as shown in FIG. 6, the pitch between the circuits such as switches or the like included in the video signal line driving circuit 120 is matched to the pitch between the transistors included in the pixel circuits.

FIG. 6 shows a case where at least one switch is provided for each column of the display elements 250. In FIG. 6, the video signal line driving circuit 120 includes six switches (switch 1, switch 2, switch 3, switch 4, switch 5 and switch 6) respectively for six columns of the display elements 250. The switches are not located in the curved region 310, but is located outer to the curved region 310. The pitch between the switches is equal to the pitch Ptft1x between the transistors tft1. The switches included in the video signal line driving circuit 120 are, for example, transistors. In this manner, the transistors included in the video signal line driving circuit 120 are located outer to the curved region 310. Wires electrically connecting the transistors are located in the region where the video signal line driving circuit 120 and the curved region 310 overlap each other. The circuits included in the video signal line driving circuit 120 is not limited to the switches. The circuit configuration may be changed as necessary. For example, a buffer circuit may be provided in front of each of the switches, so that delay of each signal is decreased. Therefore, such addition of a buffer circuit enlarges an operation margin of the switch.

With the above-described positional arrangement and locations, there is no transistor in the curved region, and the number of the wires located in the curved region is decreased. Therefore, the damage caused by the folding operation is suppressed, and thus the resultant display device is highly reliable and highly flexible.

Embodiment 2

In this embodiment, a structure of a flexible display device that suppresses damage and loss of functions that are caused by the display device being folded repeatedly will be described with reference to a schematic plan view and a cross-sectional view of a pixel included in the flexible display device. Components that are substantially the same as those in embodiment 1 may not be described.

2-1. Pixel Circuit

Figure 7:
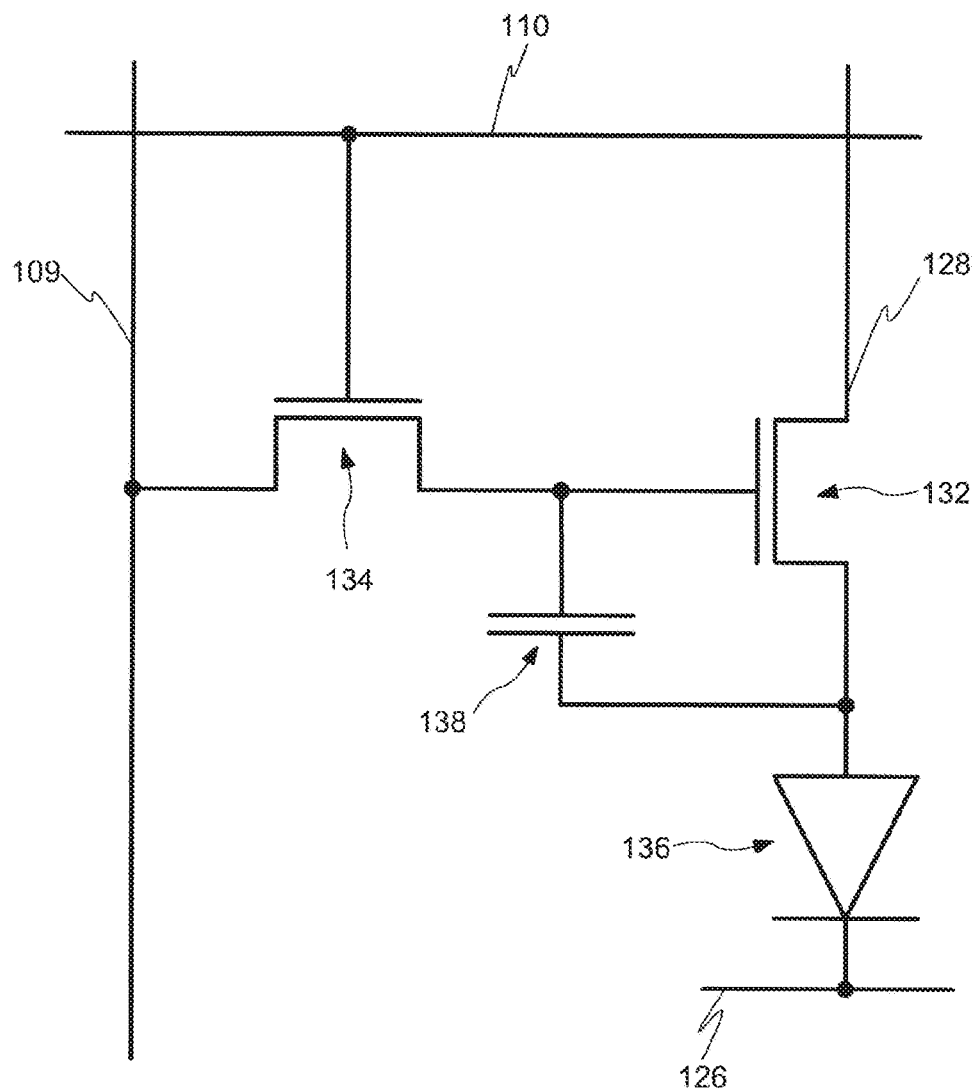
FIG. 7 is a circuit diagram of a pixel included in the display device in an embodiment according to the present invention.

FIG. 7 shows a circuit diagram of the pixel circuit PX included in the display device in an embodiment according to the present invention. The circuit configuration of the pixel circuit described below is an example, and the circuit configuration in an embodiment according to the present invention is not limited thereto.

The pixel circuit PX includes a driving transistor 132, a selection transistor 134, a light emitting element 136 and a storage capacitance 138. The display element 250 is the light emitting element 136. The portion 108 including the components other than the display element includes at least the driving transistor 132, the selection transistor 134 and the storage capacitance 138.

The driving transistor 132 is a transistor connected with the light emitting element 136 to control the light emitting luminance of the light emitting element 136. In the driving transistor 132, a drain current is controlled by a gate-source voltage. A gate of the driving transistor 132 is connected with a drain of the selection transistor 134, a source of the driving transistor 132 is connected with the driving power supply line 128, and a drain of the driving transistor 132 is connected with an anode electrode of the light emitting element 136.

The selection transistor 134 is a transistor that controls the conductive state between the video signal line 109 and the gate of the driving transistor 132 by an on-off operation. A gate of the selection transistor 134 is connected with the scanning signal line 110, a source of the selection transistor 134 is connected with the video signal line 109, and the drain of the selection transistor 134 is connected with the gate of the driving transistor 132.

The anode electrode of the light emitting element 136 is connected with the drain of the driving transistor 132, and a cathode electrode of the light emitting element 136 is connected with a reference power supply line 126.

The storage capacitance 138 is connected between the gate and the drain of the driving transistor 132. The storage capacitance 138 retains a gate-drain voltage of the driving transistor 132.

In this example, the reference power supply line 126 is commonly provided for the plurality of pixel circuits PX. The reference power supply line is supplied with a constant voltage by the plurality of electrode terminals 116.

A power supply circuit generating a constant voltage may be provided on the upper surface of the base film 142. The power supply circuit generating a constant voltage is connected with the reference power supply line 126 commonly provided for the plurality of pixel circuits PX, and supplies a constant voltage to the cathode electrode of the light emitting element 136.

2-2. Structure of the Display Region

Hereinafter, a structure of the display region 106 will be described with reference to FIG. 8 through FIG. 12.

Figure 8:
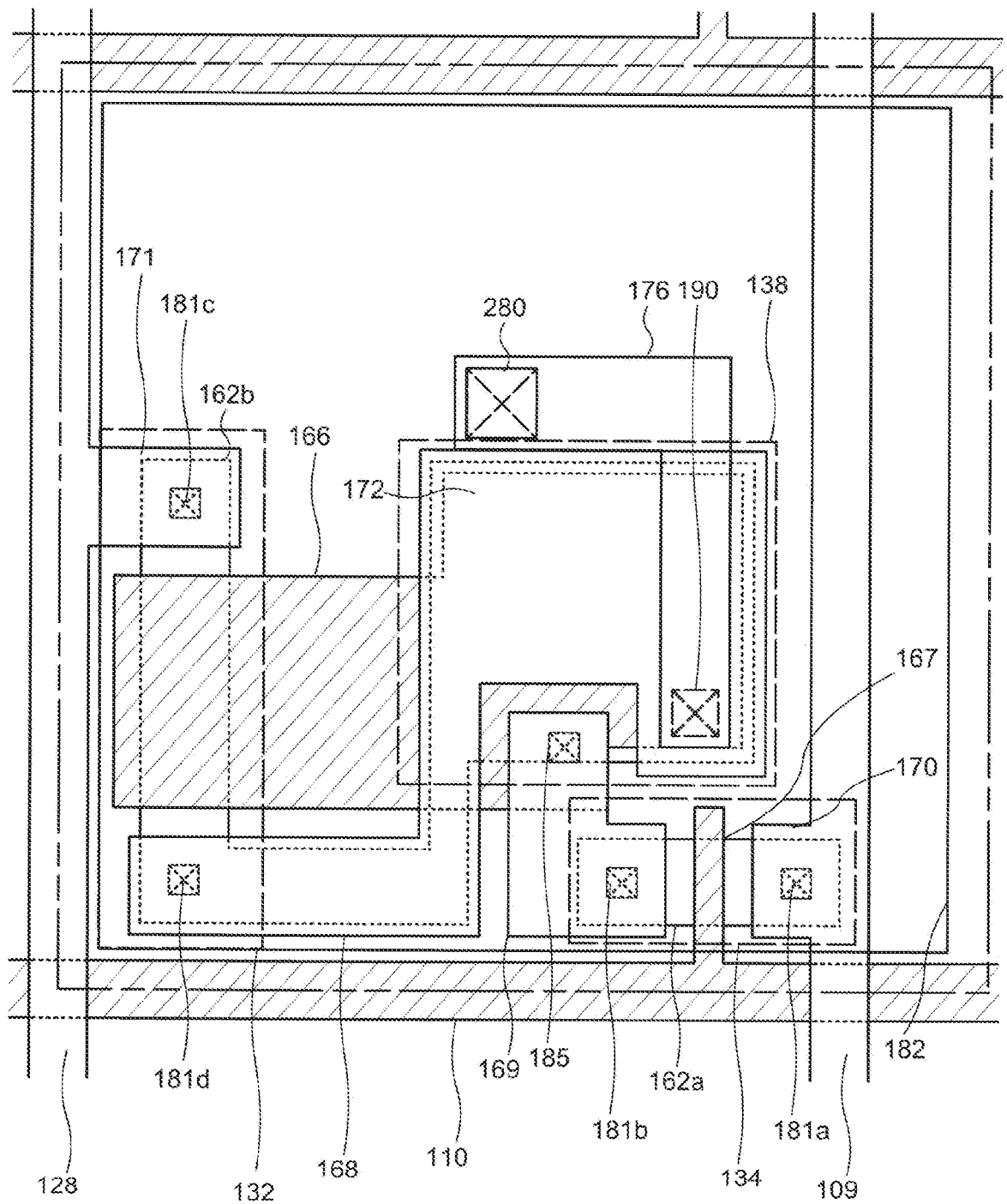
FIG. 8 shows a layout of the pixel included in the display device in an embodiment according to the present invention.
Figure 11:
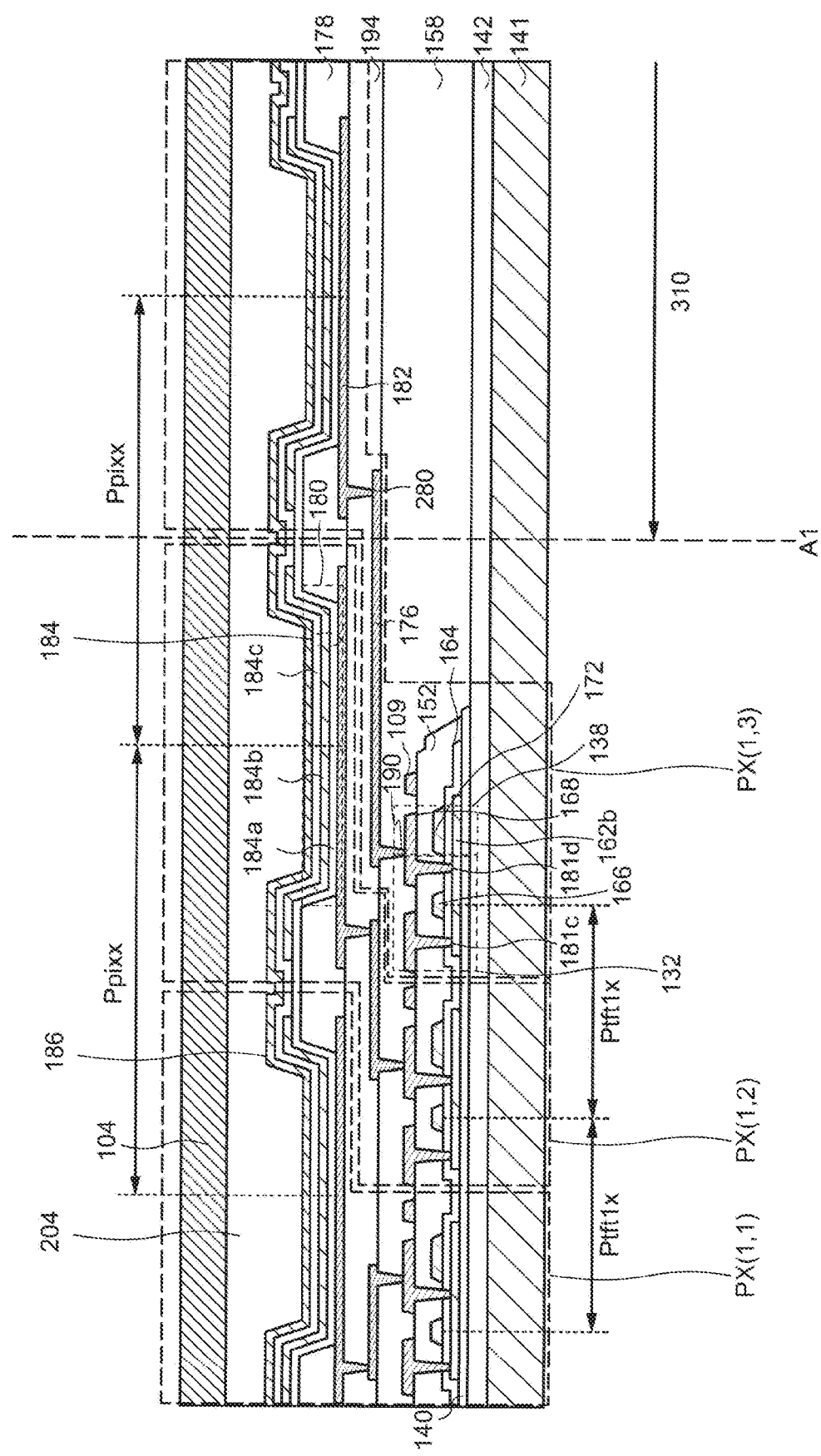
FIG. 11 is a schematic cross-sectional view of the display region included in the display device in an embodiment according to the present invention.
Figure 12:
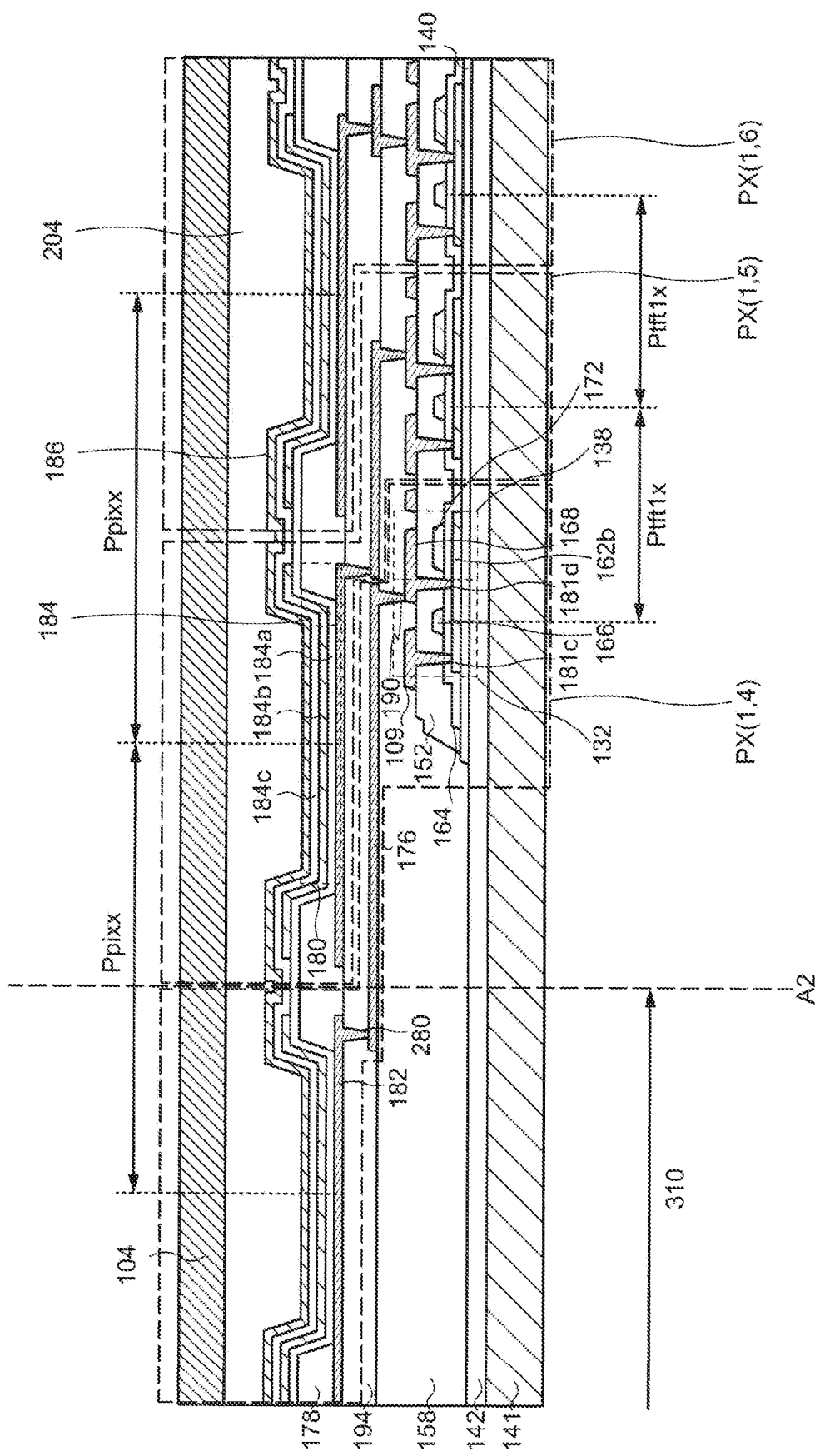
FIG. 12 is a schematic cross-sectional view of the display region included in the display device in an embodiment according to the present invention.

FIG. 8 is a schematic plan view of the pixel circuit PX shown in FIG. 7. FIG. 8 shows an example in which the plurality of pixel circuits PX are located such that a pitch between the display element 250 included in a first pixel circuit and the display element 250 included in a second pixel circuit adjacent to the first pixel circuit, and a pitch between the selection transistor 134 included in the first pixel circuit and the selection transistor 134 included in the second pixel circuit adjacent to the first pixel circuit, are equal to each other. The components formed after a first electrode 182 are not shown. The components formed after the first electrode 182 are shown in FIG. 11 and FIG. 12.

Figure 9:
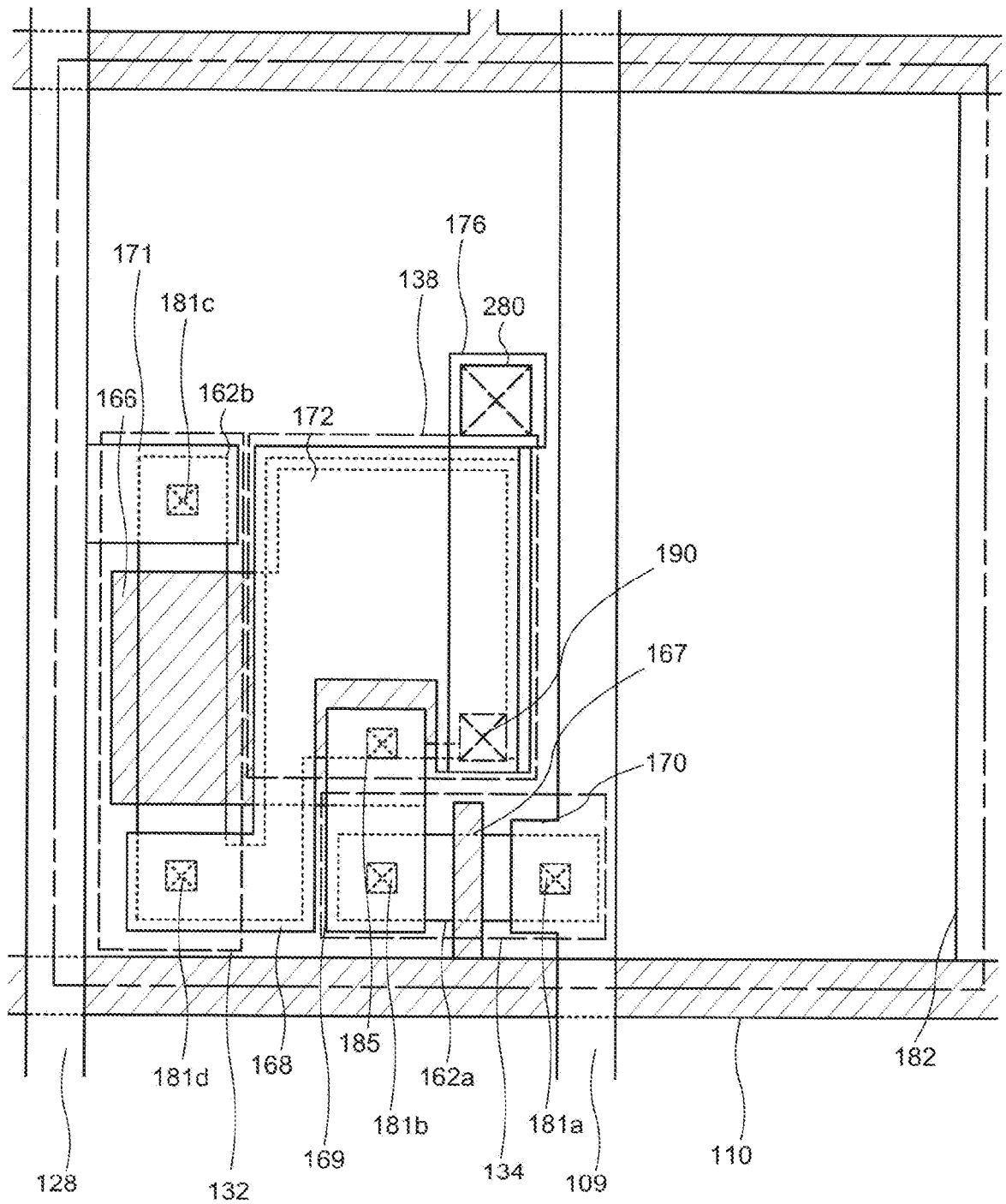
FIG. 9 shows a layout of the pixel included in the display device in an embodiment according to the present invention.

FIG. 9 is schematic plan view of the pixel circuit PX shown in FIG. 7. In the pixel circuit PX shown in FIG. 9, the components other than the display element 250, namely, the selection transistor 134, the driving transistor 132 and the like are located closer to each other than in the pixel circuit PX shown in FIG. 8. For example, the components included in the first pixel circuit, more specifically, the driving power supply line 128, the video signal line 109 and the components located between the driving power supply line 128 and the video signal line 109, may be arrayed close to each other as one unit in accordance with a designing rule of wires. Namely, FIG. 9 shows an example in which the plurality of pixel circuits PX 9 are located such that a pitch in the X direction between the selection transistor 134 included in the first pixel circuit and the selection transistor 134 included in the second pixel circuit adjacent to the first pixel circuit is shorter than a pitch in the X direction between the display element 250 included in the first pixel circuit and the display element 250 included in the second pixel circuit adjacent to the first pixel circuit. The components formed after the first electrode 182 are not shown. The components formed after the first electrode 182 are shown in FIG. 11 and FIG. 12.

The pixel circuits PX shown in FIG. 8 and FIG. 9 may each include a plurality of the transistors or a plurality of the capacitances. The components formed after the first electrode 182 are not shown. The components formed after the first electrode 182 are shown in FIG. 11 and FIG. 12.

As shown in FIG. 8 and FIG. 9, the pixel circuit PX includes a semiconductor film 162a, a semiconductor film 162b, a gate electrode 166, source/drain electrodes 168, source and drain electrodes 169, source and drain electrodes 170, and source and drain electrodes 171. The source and drain electrodes 168, the source and drain electrodes 169, the source and drain electrodes 170, and the source and drain electrodes 171 are electrically connected with source and drain regions of the semiconductor film 162 and the semiconductor film 162b respectively through openings 181d, 181b, 181a and 181c. The source and drain electrodes 171 are electrically connected with the driving power supply line 128. The source and drain electrodes 170 are electrically connected with the video signal line 109. The source and drain electrodes 169 are electrically connected with the gate electrode 166 via an opening 185. The semiconductor film 162b extends to a region below an electrode 172 of the storage capacitance. The semiconductor film 162b, the electrode 172 of the storage capacitance, and a gate insulating film 164 held between the semiconductor film 162b and the electrode 172 form the capacitance 138. The gate insulating film 164 will be described below with reference to FIG. 11. The electrode 172 of the storage capacitance is electrically connected with the gate electrode 166. The scanning signal line 110 is electrically connected with a gate electrode 167. An intermediate wire 176 is electrically connected with the source and drain electrodes 168 via an opening 190. The first electrode 182 is electrically connected with the intermediate wire 176 via an opening 280.

Figure 10:
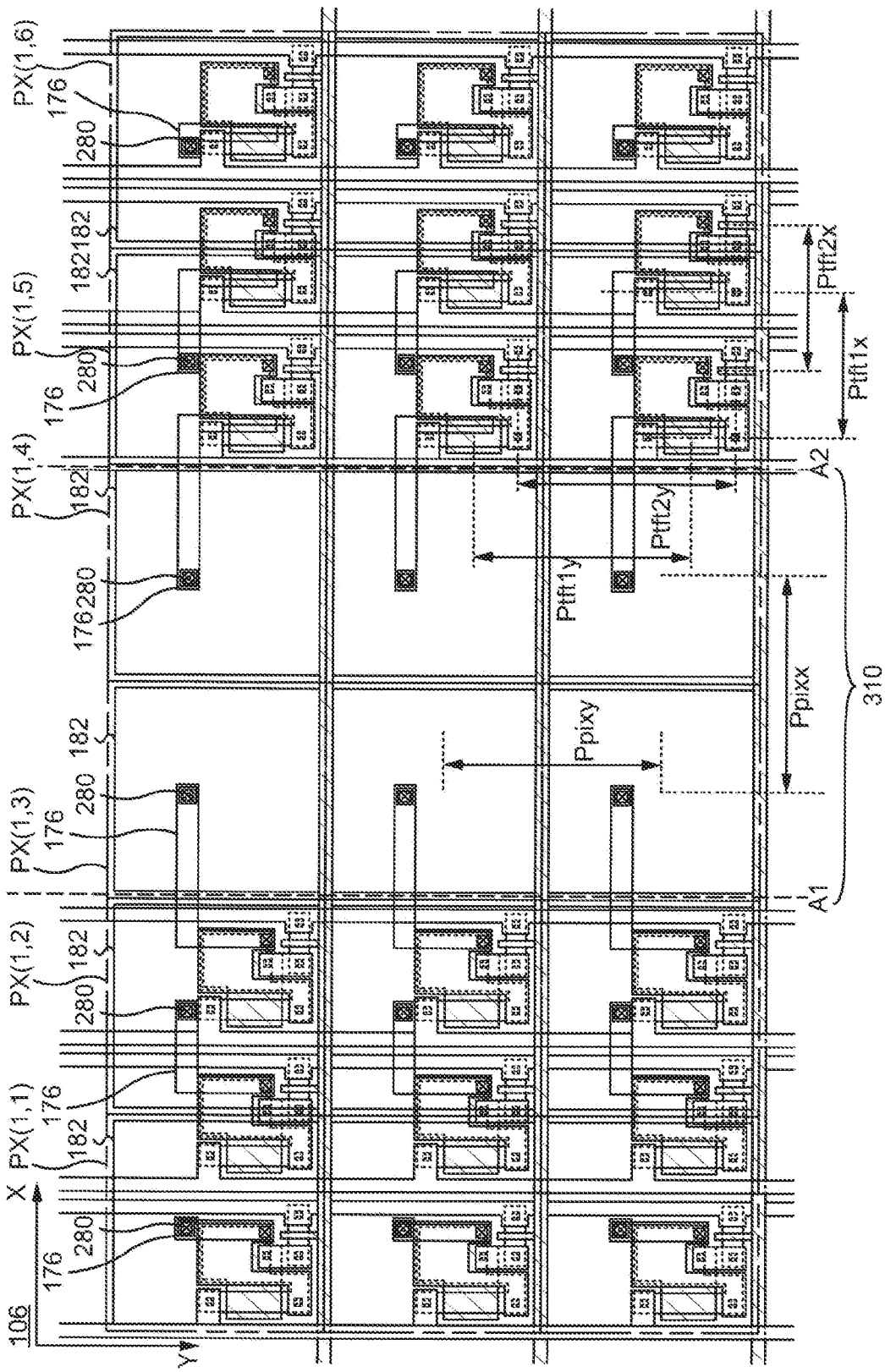
FIG. 10 shows a layout of the display region included in the display device in an embodiment according to the present invention.

FIG. 10 is a schematic plan view of a plurality of the pixel circuits PX shown in FIG. 9 arrayed in 3 rows by 6 columns in the display region 106 as shown in FIG. 5 and FIG. 6. FIG. 10 shows an example in which the transistors included in the pixel circuits PX are located in a region far from the curved region 310. The pitches between the display elements included in the pixel circuits PX are equal to each other. The pitches between the transistors included in the pixel circuits PX are equal to each other. The pitches between the display elements included in the pixel circuits PX are different from the pitches between the transistors included in the pixel circuits PX. FIG. 10 does not show the components formed after the first electrode 182. The components formed after the first electrode 182 are shown in FIG. 11 and FIG. 12. The transistors included in the pixel circuits PX are located outer to the curved region 310. The plurality of scanning signal lines 110 and a plurality of the intermediate wires 176 are located in the curved region 310 and the display region 106.

FIG. 10 shows an example in which the transistors included in the pixel circuits PX are located in the region far from the curved region 310. The locations of the transistors included in the pixel circuits PX are not limited thereto. The transistors included in the pixel circuits PX may be located in a region that is outer to the curved region 310 and is in the display region. For example, the transistors included in the pixel circuits PX may be located in a region that is outer to the curved region 310 sandwiched between line A1 and line A2 and is close to line A1. Alternatively, the transistors included in the pixel circuits PX may be located in a region that is outer to the curved region 310 sandwiched between line A1 and line A2 and is close to line A2. In the case where the transistors included in the pixel circuits PX are located in a region that is outer to the curved region 310 and is in the display region, the degree of freedom of layout is improved. Such improvement in the degree of freedom of layout allows the curved region to be provided at a plurality of positions. In the case where the curved region is provided at a plurality of positions, the display device may be folded more flexibly.

FIG. 11 and FIG. 12 are each a schematic cross-sectional view of the pixel circuits arrayed in the X direction (direction crossing the curved region 310) from row 1 and column 1 to row 1 and column 6 in the display region 106 shown in FIG. 10. FIG. 11 and FIG. 12 each show a case where the pitches between the transistors 132 included in the pixel circuits PX are equal to each other (the pitch between the transistors is labeled as Pftf1x).

A stack structure of the display device 100 will be described with reference to FIG. 11 and FIG. 12. The display device 100 includes the driving transistors 132 and the capacitances 132 on the upper surface of the base film 142 described in the "Overall structure". An underlying film 140 is optionally provided between the driving transistors 132/ the capacitances 132 and the base film 142. As shown in, for example, FIG. 11, the transistors 134 each include the semiconductor film 162b, the gate insulating film 164, the gate electrode 166, and the source and drain electrodes 168. A region of the semiconductor film 162b that overlaps the gate electrode 166 is a channel region. The channel region is held between a pair of electrodes, namely, the source and drain regions (not shown). The source and drain electrodes 168 are electrically connected with the source and drain regions (not shown) via the openings 181d and 181c provided in the gate insulating film 164. As shown in FIG. 8 and FIG. 9, the source and drain electrodes 169 are also electrically connected with the gate electrode 166 via the opening 185 provided in an interlayer film 152. The semiconductor film 162b extends to a region below the electrode 172 of the storage capacitance. The semiconductor film 162b, the electrode 172 of the storage capacitance and the gate insulating film 164 held between the semiconductor film 162b and the electrode 172 form the capacitance.

There is no limitation on the structure of the driving transistor 134. The driving transistor 134 may be a so-called top-gate transistor as shown in FIG. 8 and FIG. 9, a bottom-gate transistor, a multi-gate transistor including a plurality of the gate electrodes 166, or a dual-gate transistor including the gate electrodes 166 above and below the semiconductor film 162. There is no limitation on which of the semiconductor film 162 and the source and drain electrodes 168 is above or below.

Now, referring to FIG. 11 and FIG. 12, the pixel circuit PX (1, 3) and the pixel circuit PX (1, 4) closest to the curved region 310 will be discussed. It is seen that ends of the underlying film 140, the gate insulating film 164 and the interlayer film 152 are tapered, and that the interlayer film 152 is covered with a flattening film 158 (described below). It is seen that the ends of the underlying film 140, the gate insulating film 164 and the interlayer film 152 are located outer to the region where the curved region 310 and the display region 106 overlap each other. It is also seen that the transistor 134 is located inner to the ends of the underlying film 140, the gate insulating film 164 and the interlayer film 152 (far from line A1 and far from line A2).

The underlying film 140 has a function of preventing diffusion of impurities from the substrate 102. The underlying film 140 may be formed of, for example, an inorganic compound such as silicon oxide, silicon nitride oxide, silicon oxide nitride, silicon nitride or the like. The underlying film 140 is formed by, for example, a CVD method or the like. The gate insulating film 164 may be formed of an appropriate combination of materials usable for the underlying film 140. The gate insulating film 164 may be formed by any of methods usable to form the underlying film 140. The interlayer film 152 may have a single layer structure or a stack structure formed of an appropriate combination of materials usable for the underlying film 140 and the gate insulating film 164. For example, a stack structure of silicon nitride and silicon oxide may be used. The interlayer film 152 may be formed by any of methods usable to form the underlying film 140.

The ends of the underlying film 140, the gate insulating film 164 and the interlayer film 152 formed of an inorganic compound are located outer to the curved region 310. With such an arrangement, the films containing an organic compound are prevented from being damaged even though the display device 100 is folded along the curved region 310. The display device 100 is foldable more easily than in a case where the films containing an inorganic compound is present in the curved region 310. Therefore, the display device 100 is highly reliable.

The capacitance 138 is formed of a part of the source and drain electrodes 168, the electrode 172 of the storage capacitance, the gate insulating film 164 and the interlayer film 152. The capacitance 138 has a role of retaining the voltage supplied to the gate electrode 166. The electrode 172 of the storage capacitance is electrically connected with the gate electrode 166. The gate electrode 166, the electrode 172 of the storage capacitance, and the source and drain electrodes 168 may each have a single layer structure or a stack structure formed of a metal material such as aluminum (Al), copper (Cu), titanium (Ti), molybdenum (Mo), tantalum (Ta), tungsten (W) or the like, or an alloy thereof. For example, a highly conductive metal material such as aluminum (Al), copper (Cu) or the like and a highly blocking metal material such as titanium (Ti), molybdenum (Mo) or the like may be stacked. Specifically, a structure of aluminum (Al) sandwiched between titanium (Ti), a structure of aluminum (Al) sandwiched between molybdenum (Mo), a structure of aluminum (Al) sandwiched between tungsten (W), or the like may be adopted. The gate electrode 166, the electrode 172 of the storage capacitance, and the source and drain electrodes 168 may be formed by, for example, an MOCVD method, a sputtering method or the like.

On the transistor 132 and the capacitance 138, the flattening film 158 absorbing roughness caused by the transistor 132 and the capacitance 138 to provide a flat surface is provided. The flattening film 158 may be formed of, for example, a polymer material such as acrylic resin, epoxy resin, polyimide, polysiloxane or the like. The flattening film 158 may be formed by, for example, a spin-coating method, a dip-coating method, a printing method or the like. The opening 190 reaching the source and drain electrodes 168 is provided in the flattening film 158. The intermediate wire 176 is provided to fill the opening 190. The intermediate wire 176 may be formed of any of substantially the same materials, by any of substantially the same methods and by any of substantially the same devices as those of the gate electrode 166, the electrode 172 of the storage capacitance, and the source and drain electrodes 168.

An intermediate wire insulating film 194 is formed to cover a part of the intermediate wire 176 and the flattening film 158. The intermediate wire insulating film 194 absorbs the roughness caused by the intermediate wire 176 to provide a flat surface. The intermediate wire insulating film 194 may be formed of any of substantially the same materials, by any of substantially the same methods and by any of substantially the same devices as those of the flattening film 158.

The opening 280 reaching the intermediate wire 176 is provided in the intermediate wire insulating film 194, and the first electrode 182 is provided to fill the opening 280. A partition 178 is provided to cover the first electrode 182. The openings such as the opening 181d, the opening 181c, the opening 190, the opening 280 and the like are formed by performing etching respectively on the interlayer film 152, the gate insulating film 164, the flattening film 158, the intermediate wire insulating film 194 and the like. The etching may be, for example, dry etching using fluorine-containing alkane or alkene.

A light emitting element 180 includes the first electrode 182, a second electrode 186 and an EL layer 184 provided between the electrode 182 and the second electrode 186. The EL layer 184 is formed to cover the first electrode 182 and the partition 178. The second electrode 186 is provided on the EL layer 184. Carriers (electrons, holes) are implanted from the first electrode 182 and the second electrode 186 to the EL layer 184, and the carriers are recombined in the EL layer 184. This forms an excited state of an organic compound contained in the EL layer 184, and energy released when this excited state is alleviated to a base state is used as light emission. Therefore, a region where the EL layer 184 and the first electrode 182 contact each other is a light emission region.

FIG. 11 shows an example in which the EL layer includes three layers (the EL layer 184a, the EL layer 184b and the EL layer 184c). There is no limitation on the layer structure of the EL layer. The EL layer may include four or more stacked layers. For example, layers such as a carrier implantation layer, a carrier transfer layer, a light emitting layer, a carrier inhibiting layer, an exciton inhibiting layer and the like may be appropriately stacked to form the light emitting element 180.

In FIG. 11, the EL layer 184a and the EL layer 184c extend toward an adjacent light emitting element, whereas the EL layer 184b (e.g., light emitting layer) is selectively provided in one light emitting element 180. This, for example, allows adjacent light emitting elements 180 to provide different colors of light. Alternatively, the EL layers 184 in adjacent light emitting elements 180 may have the same structure as each other. In this case, for example, light emitting elements capable of emitting white light may be structured and color filters having different optical characteristics may be provided for adjacent light emitting elements, so that the display device 100 may provide various colors from the light emitting elements 180 to realize full-color display.

A first passivation film 204 protecting the light emitting element 180 is provided on the light emitting element 180. The passivation film is a protective film.

The front surface barrier film 104 is provided on the first passivation film 204. The surface barrier film 104 protects the first passivation film 204 and the components provided below the first passivation film 204. The first passivation film 204 includes a first inorganic compound layer that is formed of silicon and nitrogen, carbon or oxide, an organic insulating layer of an acrylic resin-based substance, an epoxy resin-based substance, a siloxane resin-based substance or the like and is provided on the first inorganic compound layer, and a second inorganic compound layer that is formed of substantially the same material as that of the first inorganic compound layer and is provided on the organic insulating layer.

The base film 142 may be protected by a rear surface barrier film 141. The rear surface barrier film 141 may be any film containing an inorganic compound. Such a barrier film prevents entrance of moisture or the like to the display device 100. Specifically, the barrier film may be formed of a material having a water vapor transmission rate of $10^{-5}$ g/m²/day or less. The display device including such a barrier film is highly reliable. The base film 142 may be formed of a flexible material. The base film 142 may be formed of, for example, a polymer material such as polyimide, polyamide, polyester, polycarbonate or the like, or a precursor thereof. The base film 142 may contain glass microparticles or fiber mixed in such a material.

Like the rear surface barrier film 141, the front surface barrier film 104 may be any film containing an inorganic compound. Use of the front surface barrier film 104 prevents entrance of moisture or the like to the display device 100. Therefore, the resultant display device is highly reliable.

As shown in FIG. 11 and FIG. 12, the transistors are located outer to the curved region 310.

As shown in FIG. 11 and FIG. 12, the intermediate wires 176 are located in the curved region 310 and the display region 106.

With the above-described positional arrangement and locations, the curved region is easily foldable. The region other than the curved region, namely, the region where the transistors and the like are located is more rigid than the curved region. Therefore, a structure in which a region to be folded is easily foldable and a region to be protected is difficult to be folded is realized. The resultant display device is highly reliable.

Embodiment 3

In this embodiment, a structure of a display region different from that in embodiment 1 and embodiment 2 will be described. Components that are substantially the same as those in embodiment 1 and embodiment 2 may not be described. In the structure of the display region described in this embodiment, the pixel circuits are located in a mirror layout with respect to a center line of the curved region (the centerline extends in the Y direction).

Figure 13:
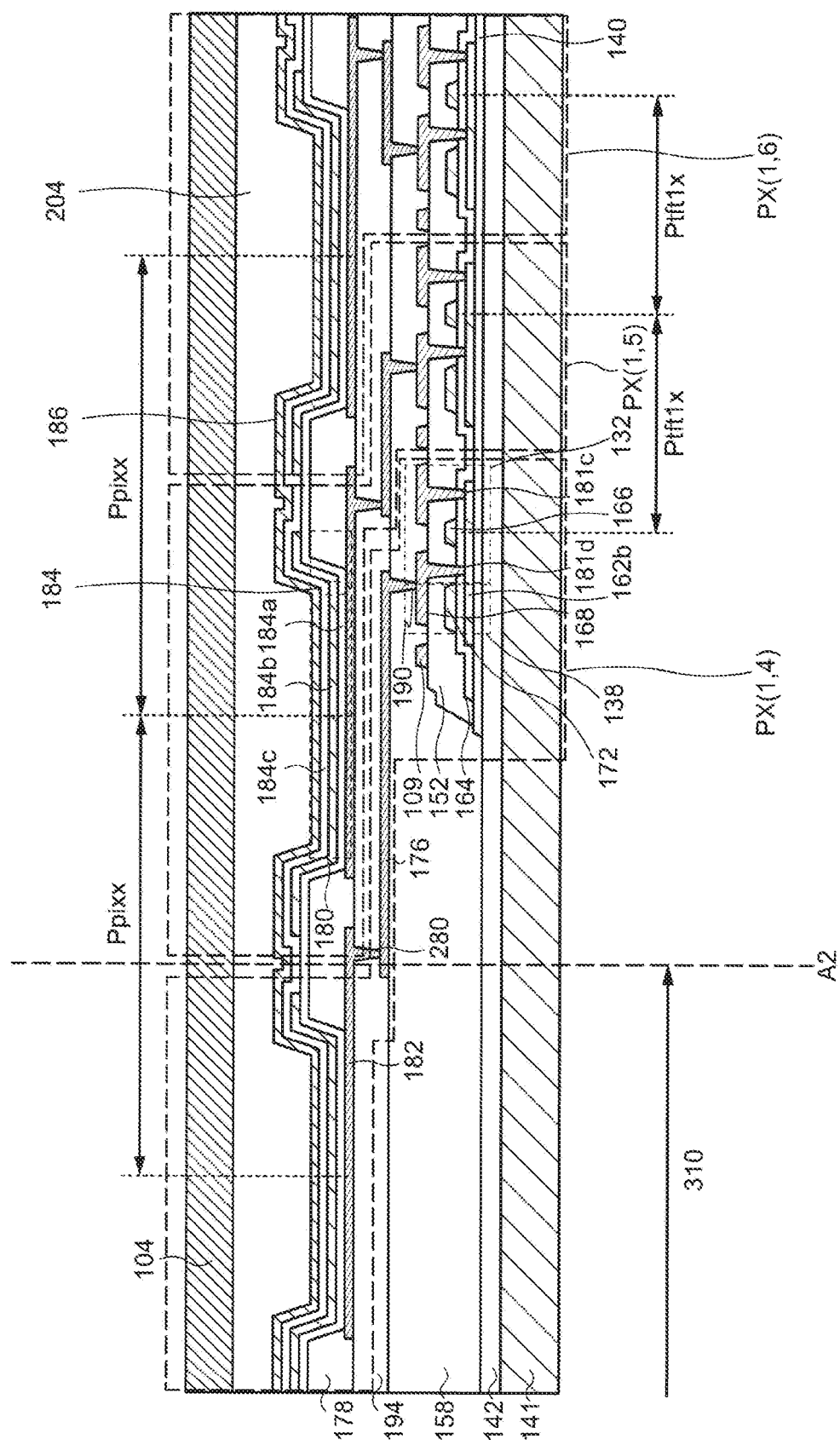
FIG. 13 is a schematic cross-sectional view of the display region included in the display device in an embodiment according to the present invention.

FIG. 13 is a schematic view of a cross-section continued from the cross-section shown in FIG. 11. The pixel circuits are located in a mirror layout with respect to the center line (extending in the Y direction) of the curved region 310. According to the design of the mirror layout, the display region on the right is formed and the right display region is subjected to mirror image inversion to realize the right and left display regions. This is expected to improve the work efficiency and makes mask design easy. This also allows the curved region 310 to be larger. As can be seen, in the case where the display region is subjected to mirror image inversion, the curved region 310 is easier to be folded as compared with the case where the display region is not subjected to mirror image inversion.

Embodiment 4

In this embodiment, a structure of a display region different from that in embodiments 1 to 3 will be described. Components that are substantially the same as those in embodiments 1 to 3 may not be described. In the structure of the display region described in this embodiment, the pitches between the transistors are different.

Figure 14:
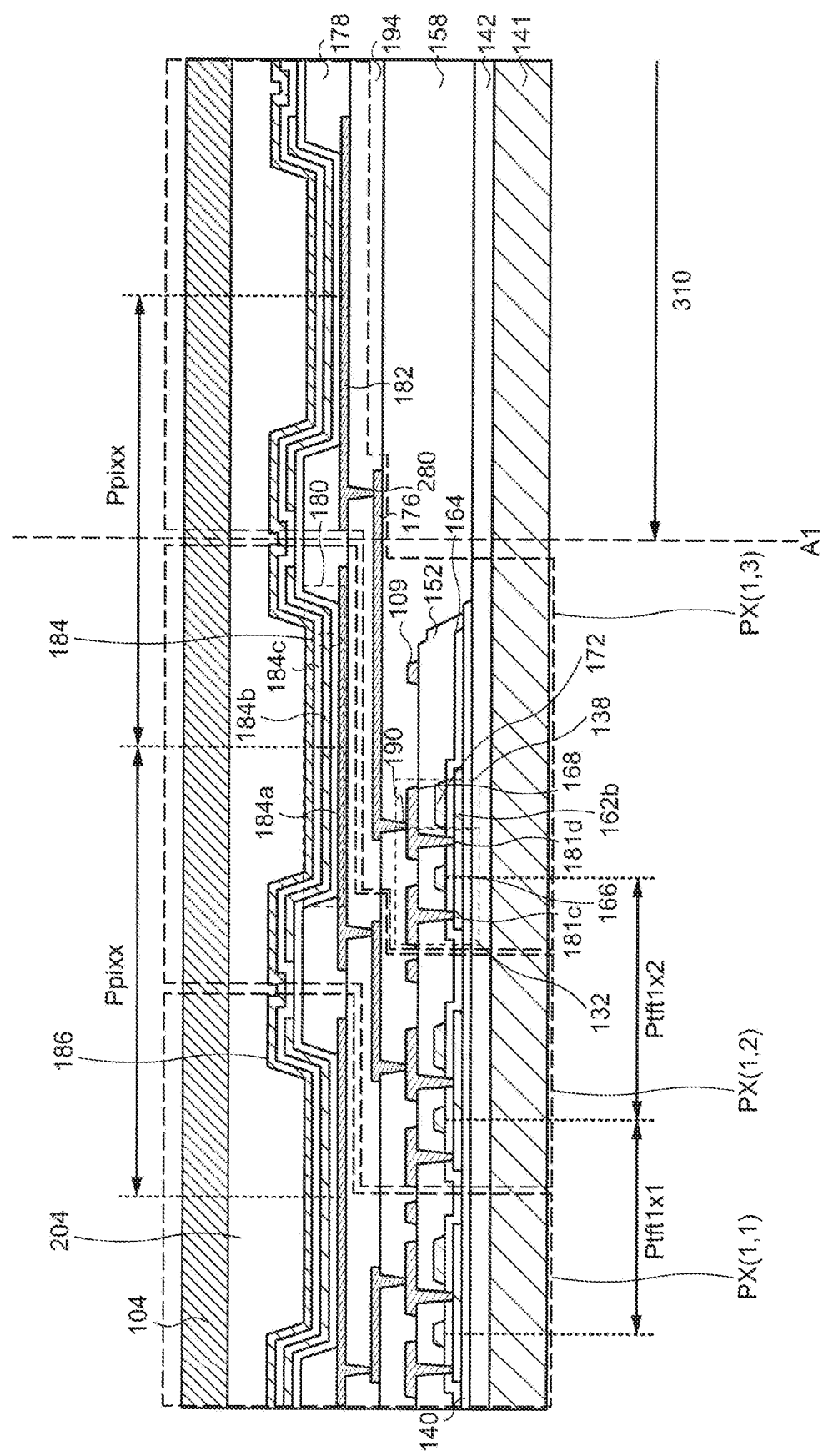
FIG. 14 is a schematic cross-sectional view of the display region included in the display device in an embodiment according to the present invention.
Figure 15:
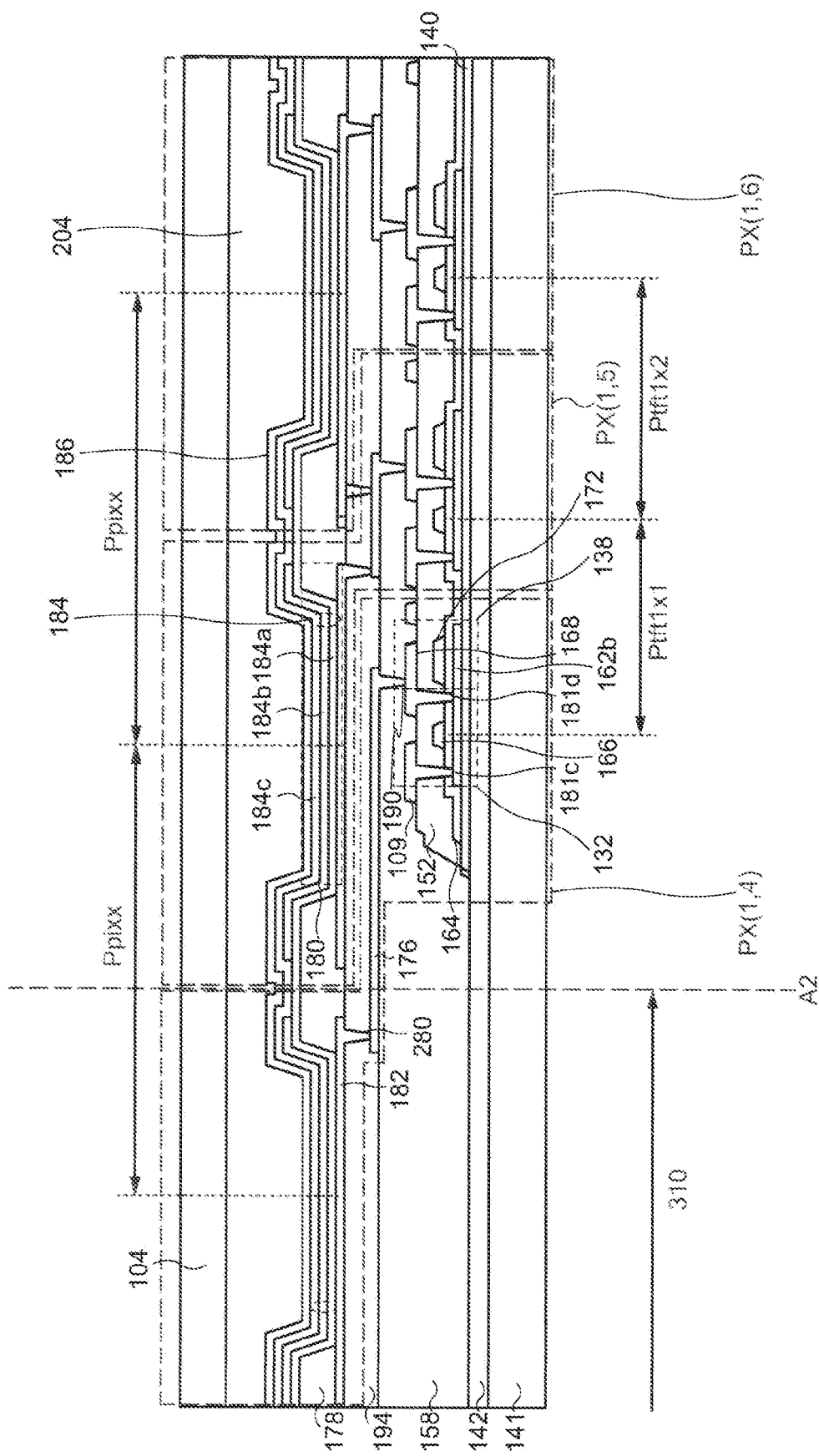
FIG. 15 is a schematic cross-sectional view of the display region included in the display device in an embodiment according to the present invention.

FIG. 14 shows a left region, and FIG. 15 shows a right region, with respect to the center line (extending in the Y direction) of the curved region 310. FIG. 15 is a schematic view of a cross-section continued from the cross-section shown in FIG. 14. Since the pitches between the transistors in the pixel circuits are different, the degree of freedom of design is improved.

Embodiment 5

In this embodiment, a structure of a display device including a curved region extending in the direction substantially perpendicular to the scanning signal line driving circuit will be described. Components that are substantially the same as those in embodiments 1 to 4 may not be described.

Figure 16:
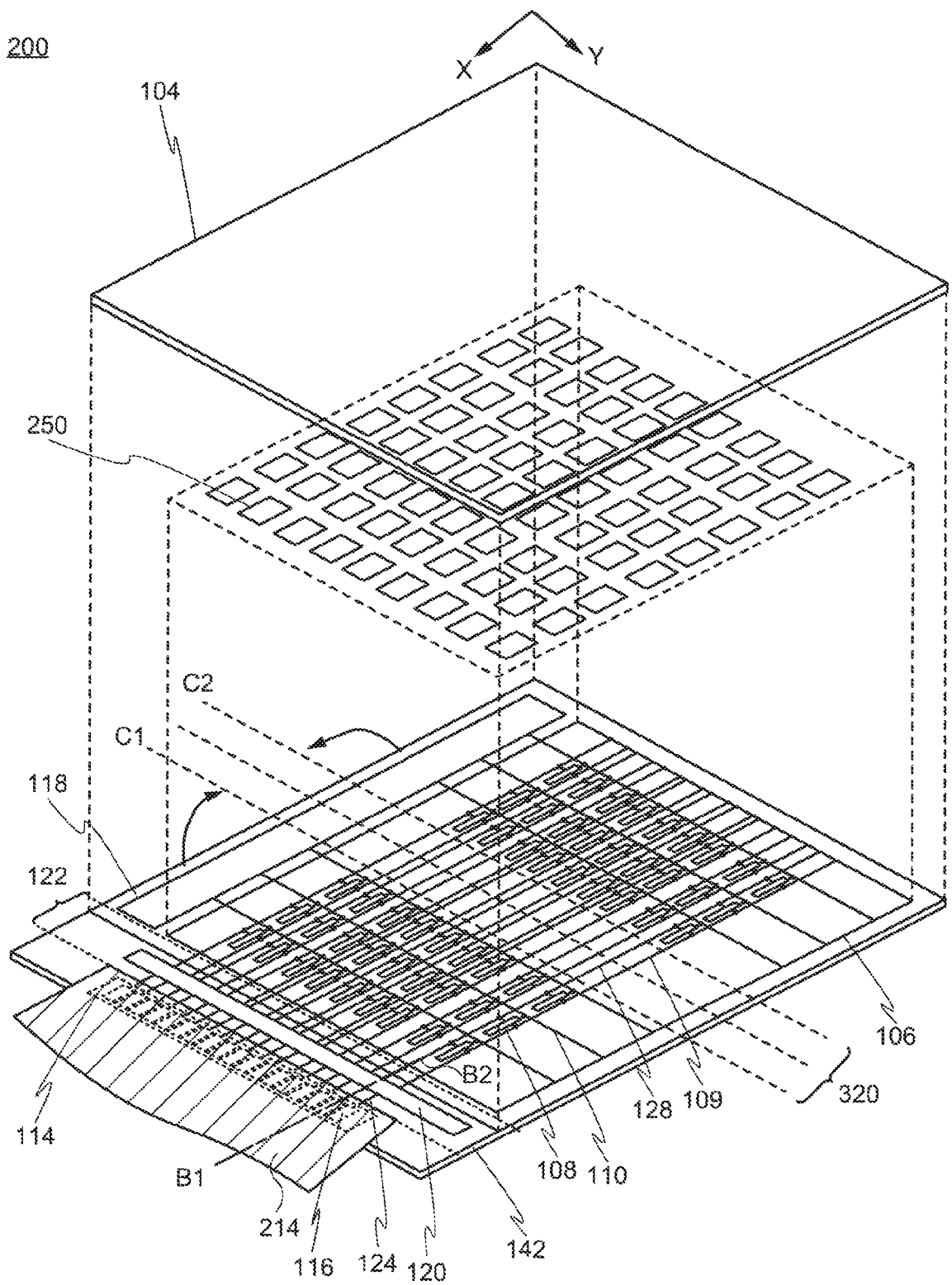
FIG. 16 is a schematic perspective view of a display device in an embodiment according to the present invention.

FIG. 16 is a schematic perspective view of a display device 200 in an embodiment according to the present invention. Unlike the display device 100 shown in FIG. 2, the display device 200 includes a curved region 320 extending in the direction substantially perpendicular to the scanning signal line driving circuit. Regarding FIG. 16, the components that are substantially the same as those in FIG. 2 will not be described. The display device 200 is flexible, and is foldable along a region sandwiched between line C1 and line C2 (such a region is the curved region 320). The transistors electrically connected with the display elements 250 are included in the portions 108 including the components of the pixel circuits PX other than the display elements, and are located outer to the region where the curved region 320 and the display region 106 overlap each other. The region where the curved region 320 and the display region 106 overlap each other includes the intermediate wires (described with reference to FIG. 8 to FIG. 10) electrically connecting the display elements 250 and the transistors to each other, the plurality of video signal lines and the driving power supply line 128.

Figure 17:
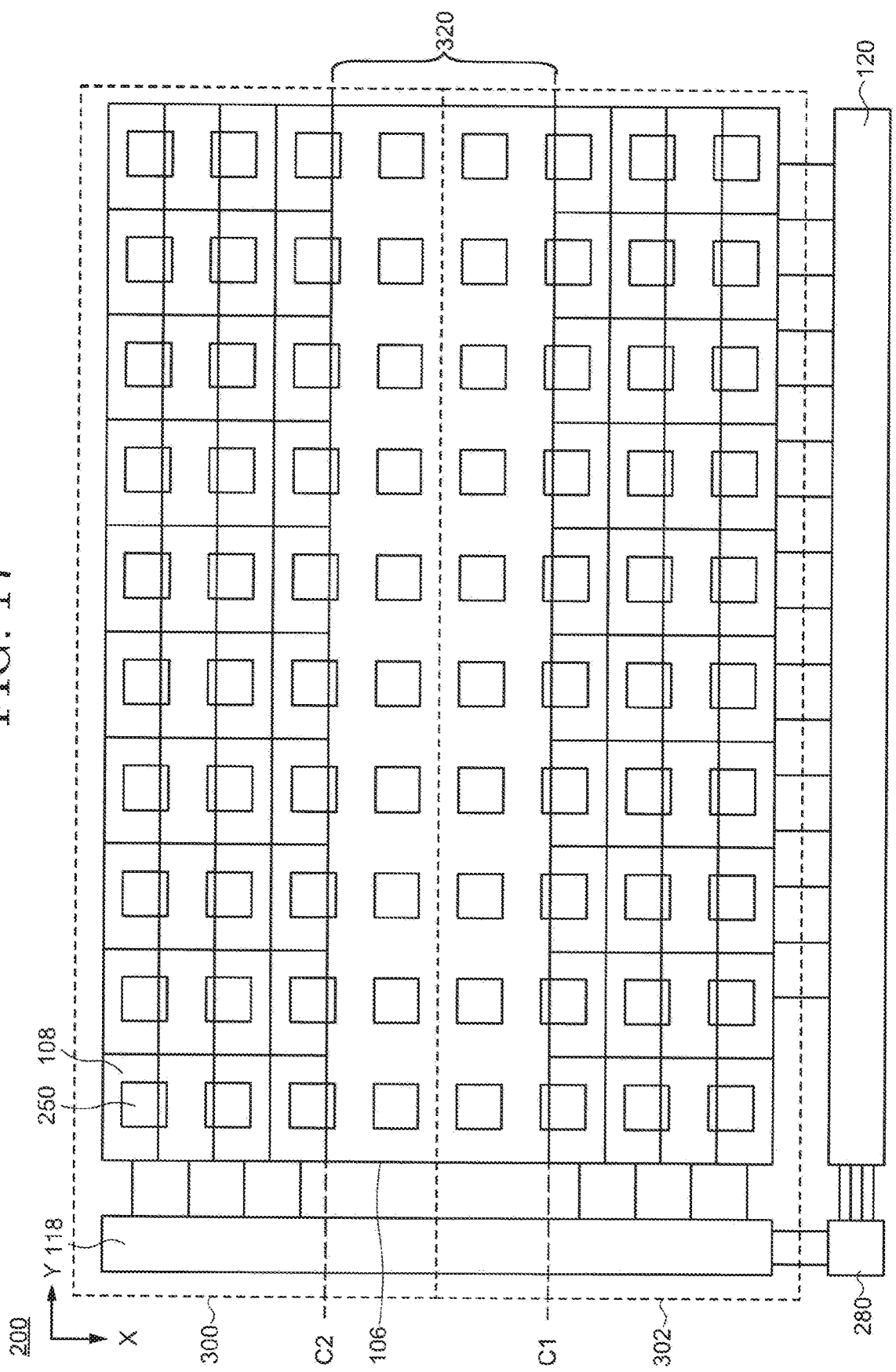
FIG. 17 is a schematic plan view showing a structure of the display device in an embodiment according to the present invention.
Figure 18:
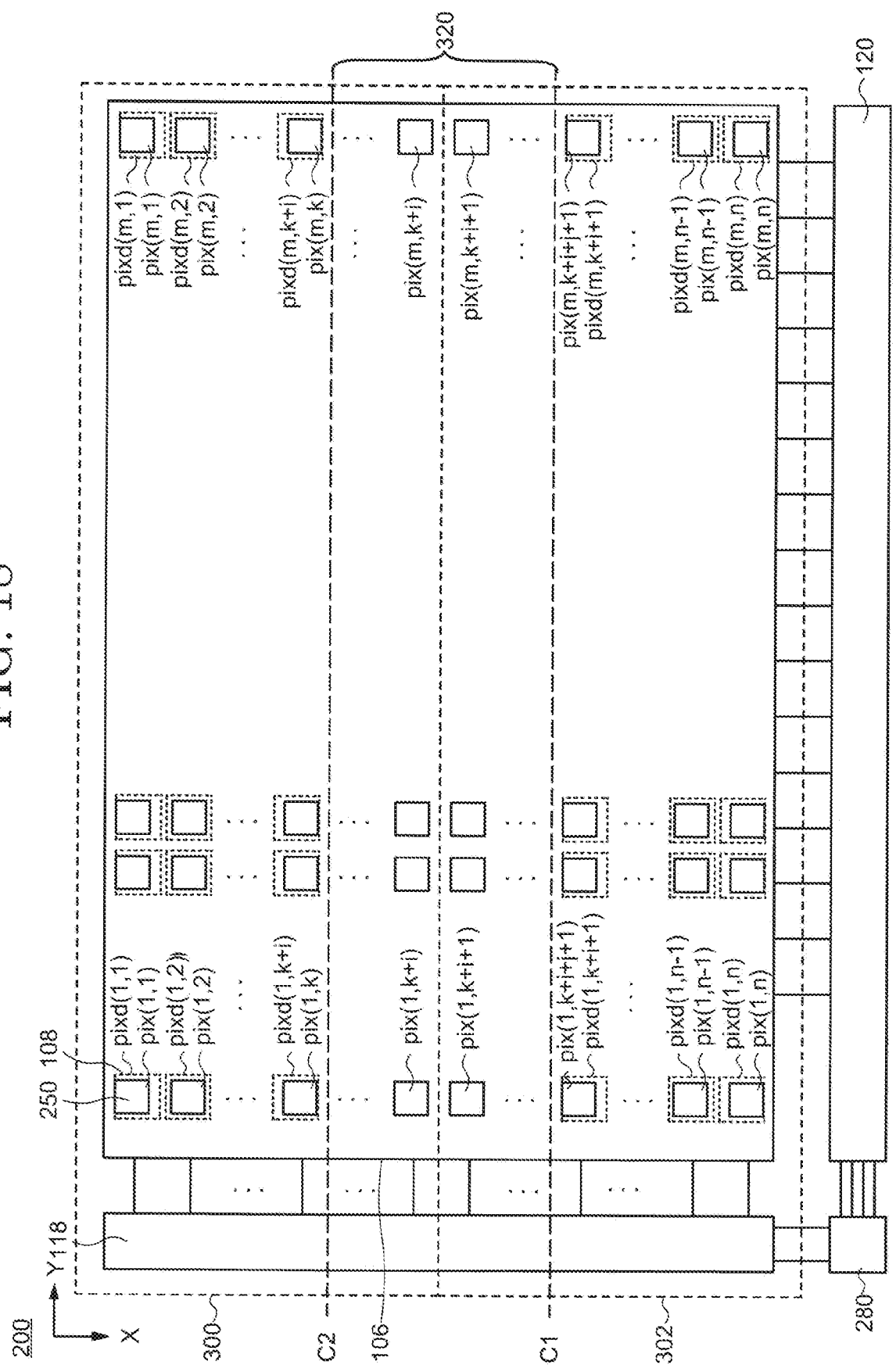
FIG. 18 is a schematic plan view showing the structure of the display device in an embodiment according to the present invention.

FIG. 17 and FIG. 18 are each a schematic plan view of the display device 200 in an embodiment according to the present invention. As shown in FIG. 17, the curved region 320 does not include the portions 108 including the components other than the display elements, and includes the display elements 250 and the intermediate wires 176 (not shown). The portions 108 including the components other than the display elements are located close to each other, outer to the curved region 320. FIG. 18 is a schematic view in which the portions 108 including the components other than the display elements are shown as being located with a gap from each other, for easier understanding. The display elements 250 are also shown as being located with a gap from each other. The display device 200 is foldable along the curved region 320. The display device 200 may include a controller 280. The display device 200 may be structured such that signals generated by the controller 280 or power supplies are supplied to the video signal line driving circuit 120 and the scanning line driving circuit 118. The signals or the power supplies controlling a video to be displayed on the display region may be supplied to the controller 280 from an external circuit (not shown) via the connector 214, a connection terminal 114, wires 124 and the like. The display device 200 includes the controller 280 and therefore, allows the number of signals and power supplies to be input from the connector 214 to be decreased. One scanning signal line 110 is connected with (2$k$+i+j) pieces of display elements 250 and (2$k$+i+j) pieces of portions 108 including the components other than the display elements. A part of one scanning signal line 110 that is above line C2 (with smaller numbers in the X direction) is connected with k pieces of display elements 250 and (k+i) pieces of portions 108 including the components other than the display elements. A part of one scanning signal line 110 that is in the curved region 320 is connected with (i+j) pieces of display elements 250 and (i+j) pieces of intermediate wires 176. A part of one scanning signal line 110 that is below line C1 (with larger numbers in the X direction) is connected with k pieces of display elements 250 and (k+j) pieces of portions 108 including the components other than the display elements. Here, i, j, and k are each a natural number larger than 1. Here, n is 2$k$+i+j.

Figure 19:
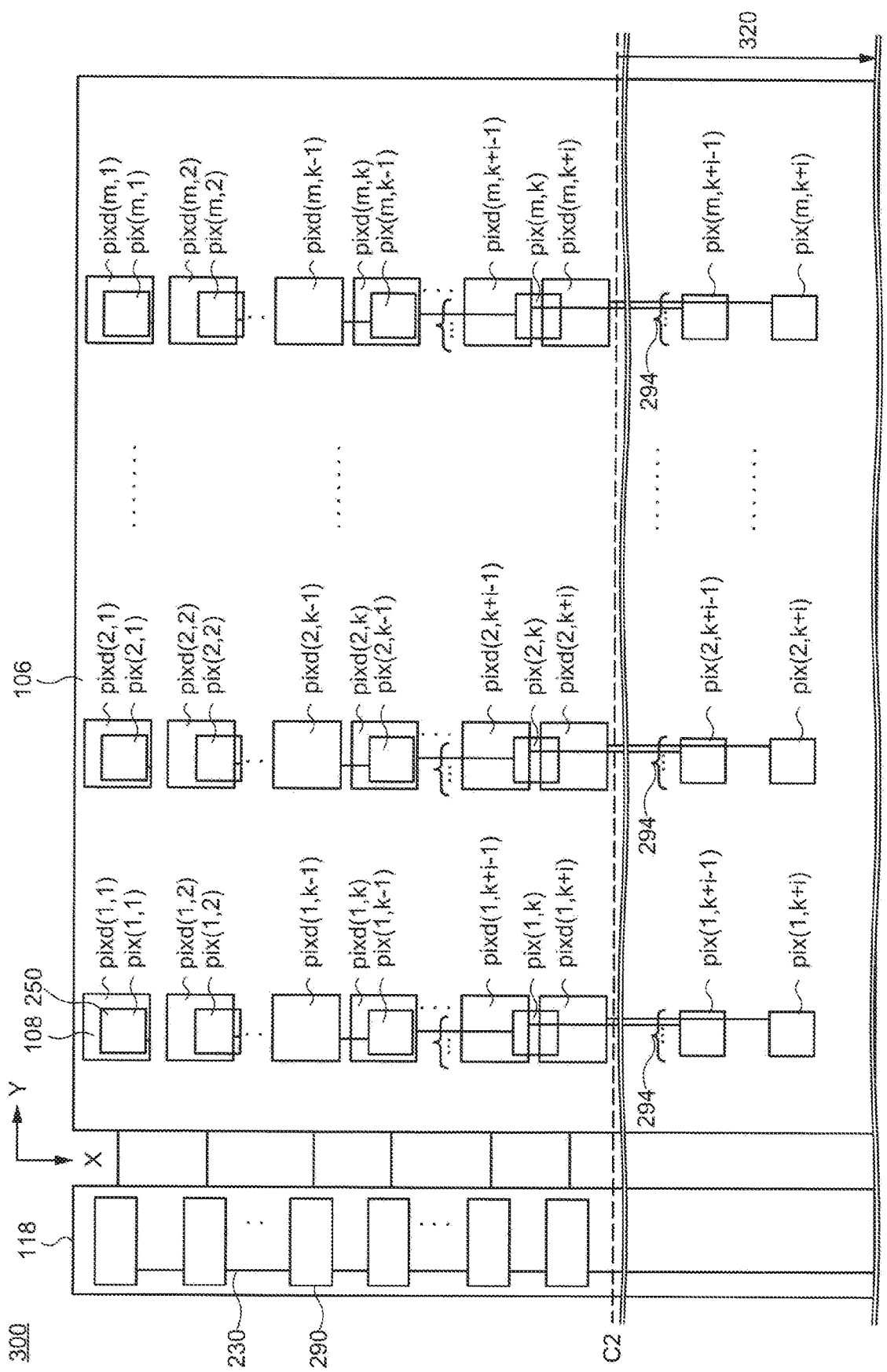
FIG. 19 is a schematic plan view showing the structure of the display device in an embodiment according to the present invention.
Figure 20:
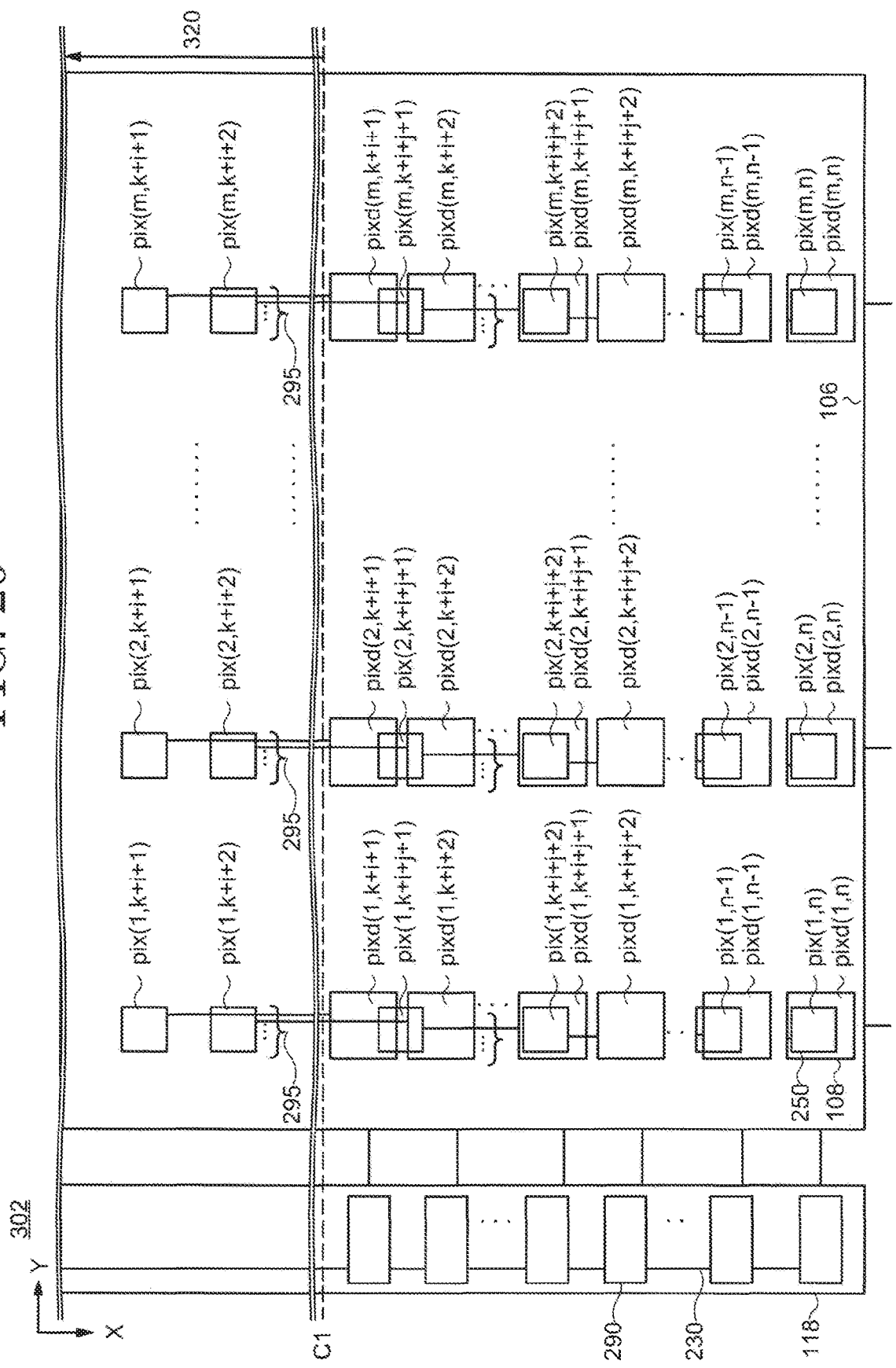
FIG. 20 is a schematic plan view showing the structure of the display device in an embodiment according to the present invention.

FIG. 19 is an enlarged detailed view of a region 300 shown in FIG. 18. In the display device 200, the display elements 250 are located in a matrix of m rows by n columns. m and n are each a natural number larger than 1. In the pixel circuits PX, the portions 108 including the components other than the display elements are provided in a matrix of m×n, and the transistors ftf1 are also provided in a matrix of m×n. A display element 250 located at row m and column n is represented as pix (m, n). The portion 108, including the components of the pixel circuit PX other than the display element 250, located at row m and column n is represented as pixd (m, n). A region where the curved region 320 and one scanning signal line 110 overlap each other includes (i+j) pieces of display elements 250. In an example shown in FIG. 19, in i pieces of pixel circuits PX located above line C2, i pieces of display elements 250 are each electrically connected with a transistor 251 included in the corresponding portion 108 including the components other than the display element. FIG. 20 is an enlarged detailed view of a region 302 shown in FIG. 18. Like in FIG. 19, in an example shown in FIG. 20, in j pieces of pixel circuits PX located below line C1, j pieces of display elements 250 are each electrically connected with a transistor 251 included in the corresponding portion 108 including the components other than the display element. For easier understanding, in FIG. 19, the display elements 250 are shown as being connected with the portions 108 including the components of the pixel circuits PX other than the display elements. Therefore, in the curved region 320, i pieces of wires 294 extending from above line C2 and j pieces of wires 295 extending from below line C1 are located. It is preferred that the i pieces of wires 294 and the j pieces of wires 295 are the intermediate wires 176 electrically connecting the transistors 251 and the display elements 250 to each other. The scanning line driving circuit 118 includes shift registers 290 and a wire 230. The shift registers 290 have a role of supplying the scanning signal lines 110 with a signal that drives the pixel circuits PX. The wire 230 has a role of electrically connecting the shift registers 290 to each other. A region where the curved region 320 and the peripheral region overlap each other includes the wire 230. A region outer to the region where the curved region 320 and the peripheral region overlap each other includes the shift registers 290 and the wire 230.

Figure 21:
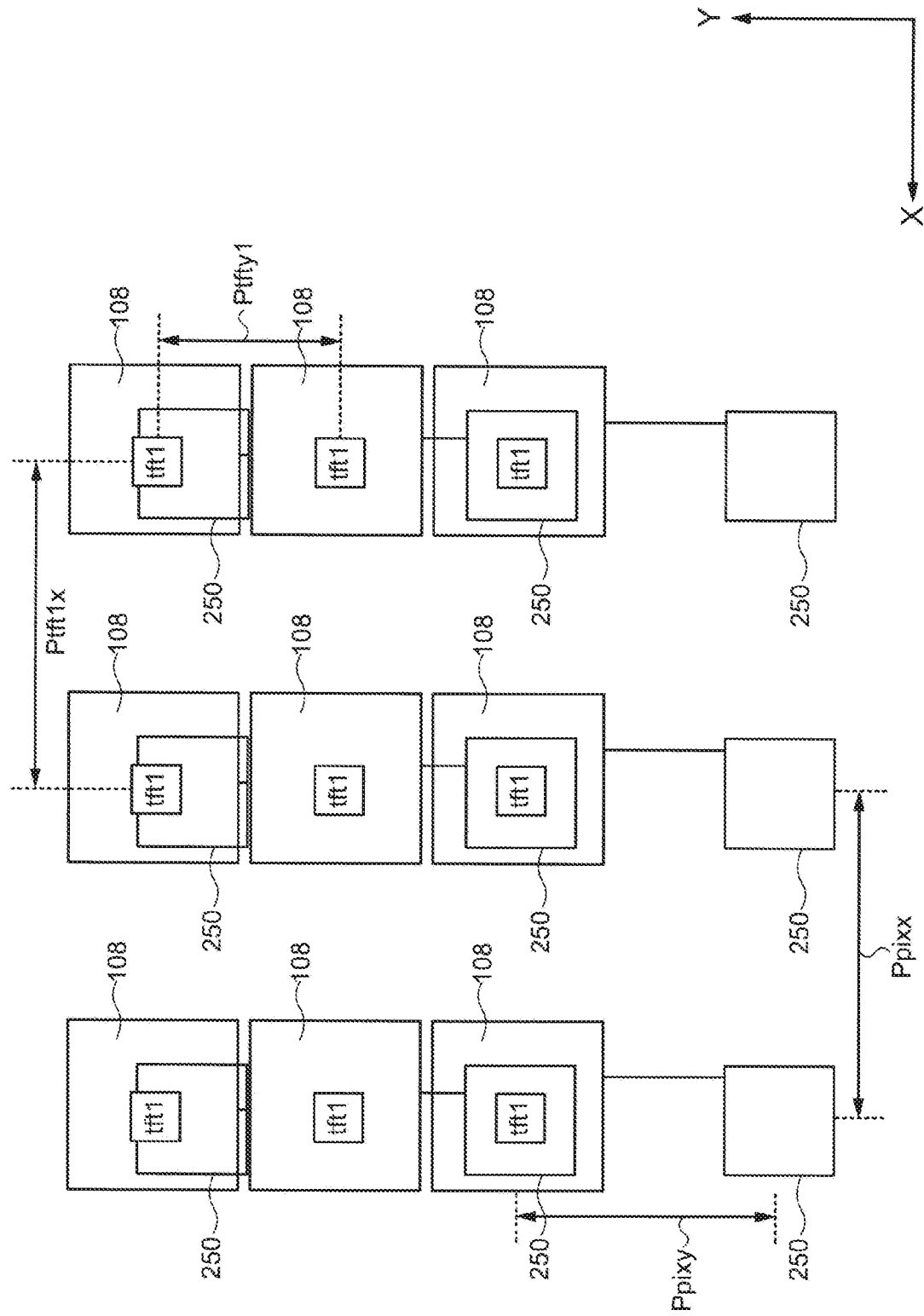
FIG. 21 is a schematic plan view showing the structure of the display device in an embodiment according to the present invention.

FIG. 21 shows the pitches between the display elements 250 in this embodiment. FIG. 21 also shows the pitches between the transistors tft1 included in the pixel circuits PX. The transistors tft1 are included in the portions 108 including the components of the pixel circuits PX other than the display elements. As shown in FIG. 21, in this embodiment, the pitch Ppixx in the X direction, and the pitch Ppixy in the Y direction, between the display elements 250 are each constant. The pitch Ptft1$x$ in the X direction, and the pitch Pftf1$y$ in the Y direction, between the transistors ftf1 are each constant. Referring to FIG. 19, the pitch between the shift registers 290 is equal to the pitch Pftf1$y$ in the Y direction between the transistors tft1. The pitch Ppixy in the Y direction between the display elements 250 is longer than the pitch Pftf1$y$ in the Y direction between the transistors tft1.

In this manner, the transistors included in the scanning signal line driving circuit 118 are located outer to the curved region 320. The wires electrically connecting the transistors acting to form the shift registers 290, switches or the like included in the scanning signal line driving circuit 118 are located in the region where the scanning signal line driving circuit and the curved region 320 overlap each other. The circuits included in the scanning signal line driving circuit 118 are not limited to the shift registers or switches. The circuit configuration may be changed as necessary. For example, a buffer may be provided between the shift registers, so that the delay between the shift registers is decreased. Thus, the operation margin of the shift registers is enlarged.

Figure 22:
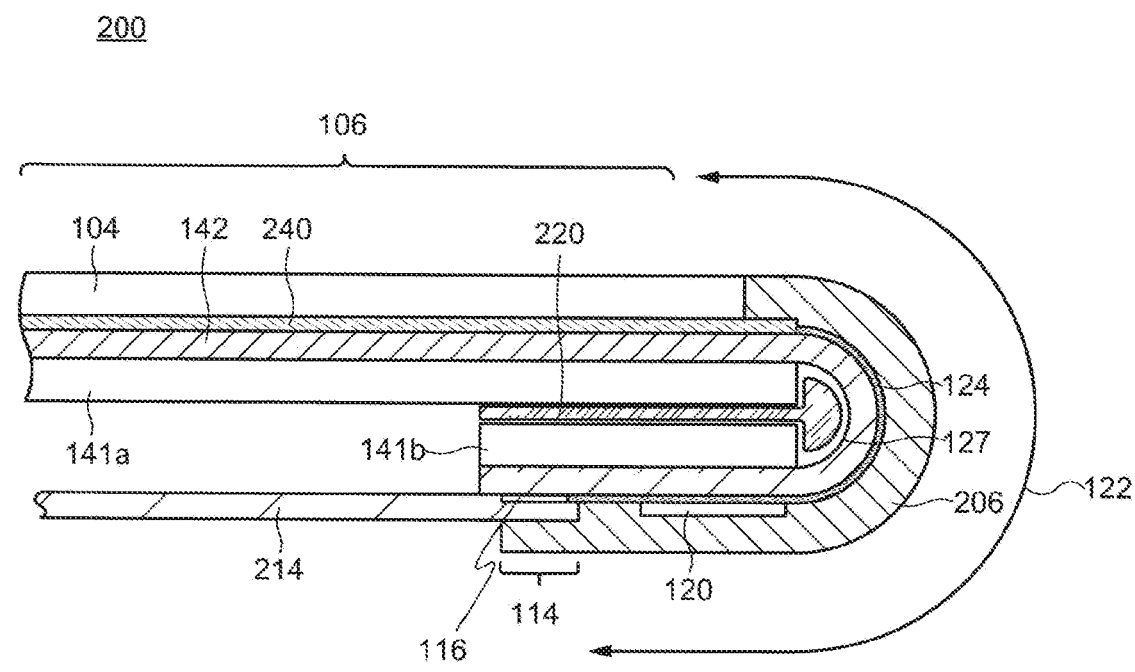
FIG. 22 is a schematic cross-sectional view of the display device in an embodiment according to the present invention.

FIG. 22 shows a cross-sectional structure of a region sandwiched between line B1 and line B2 shown in FIG. 16. FIG. 22 shows a state where the base film 142 is folded.

The base film 142 is folded such that a region between the display region 106 and the video signal line driving circuit 120, the video signal line driving circuit 120 and the terminal region 114 are on a rear surface of the display region 106. A part of a wire region 122 may overlap the rear surface of the display region 106.

On a first surface of the base film 142 (upper surface of the base film 142 in FIG. 22), a functional layer 240 is formed. On the functional layer 240, the front surface barrier film 104 may be provided optionally. Similarly, on a second surface of the base film 142 (lower surface of the base film 142 in FIG. 22), the rear surface barrier film 141 may be provided optionally. The rear surface barrier film 141 may be divided in a region where the rear surface barrier film 141 and the wire region 122 of the base film 142 overlap each other, and a first through-hole 127 may be formed. In the cross-sectional structure shown in FIG. 22, the rear surface barrier film 141 is divided into two portions (a first rear surface barrier film 141$a$ and a second rear surface barrier film 141$b$). The first rear surface barrier film 141$a$ is provided to hold the display region 106 together with the front surface barrier film 104. In the meantime, the second rear surface barrier film 141$b$ is provided to hold the base film 142 together with the electrode terminals 116. A region where the rear surface barrier film 141 is provided is thicker than a region where the rear surface barrier film 141 is not provided and the wire region 122 is provided. Therefore, the region where the rear surface barrier film 141 is not provided is easier to be folded than the region where the rear surface barrier film 141 is provided. Since the base film 142 is easy to be folded in the region where the rear surface barrier film 141 is not provided, the curved region of the display device 200 is defined by the location of the rear surface barrier film 141.

The video signal lines 109 extend from the display region 106 to the terminal region 114 via the wire region 122. The video signal lines 109 may be electrically connected with the wires 124. The video signal lines 109 and the wires 124 may be located on the same plane. The first through-hole 127 is formed in the base film 142 in the wire region 122. The formation of the first through-hole 127 allows the display device 200 to be folded easily and selectively along the wire region 122. In the case where, for example, the display device 200 has a three-dimensional structure as shown in FIG. 22, the video signal lines 109 and the base film 142 are folded at the wire region 122, and the two portions of the wire region 122 overlap each other. A second passivation film 206 protecting the video signal lines 109 and the video signal line driving circuit 120 may be provided on the first surface of the base film 142 in the wire region 122. A part of the second passivation film 206 may overlap the connector 214.

A spacer 220 may be optionally provided between the first rear surface barrier film 142a and the second rear surface barrier film 142b. The spacer 220 may include a tip semi-arcked curved portion in contact with the base film 142 and a planar portion coupled with the curved portion. The spacer 220 is located to be in contact with the lower surface of the base film 142 in the region where the base film 142 is foldable, and thus acts to keep the folding radius (radius of curvature) of the display device 200 constant. The planar portion is held between the first rear surface barrier film 141a and the second rear surface barrier film 141b, and thus the spacer 220 is stably held in the display device 200. Therefore, use of the spacer 220 stabilizes the shape of the display device 200.

The video signal line driving circuit 120 may be an IC chip. The video signal line driving circuit 120 may be mounted on the connector 214. Since the connector 214 in the display device 200 is folded to be along the spacer 220, the space for the connector 214 is made unnecessary to decrease the size of the frame portion. Since the electrode terminals 116 and the video signal line driving circuit 120 are foldable to be along the spacer, the display device is foldable while the electrode terminals 116 and the video signal line driving circuit 120 are prevented from being broken.

FIG. 23 is a schematic perspective view showing the display device 200 shown in FIG. 16 in a state of being folded along the region (curved region 320) sandwiched between line C1 and line C2. The curved region 320 may be partially foldable as shown in FIG. 23 or may be entirely foldable mildly (not shown). FIG. 23 shows an example in which the curved region 320 is folded such that the connector 214 is on the rear surface of the display region 106 like in FIG. 22. In the example shown in FIG. 23, the connector 214 is electrically connected with a circuit board 306 driving the display device 200. With such a structure, the circuit board 306 overlaps the display device 200, which decreases the size and the thickness of the display device.

With the above-described positional arrangement and locations, the transistors are not located in the curved region, and the number of the wires and the like in the curved region is decreased. Therefore, the damage caused by the folding operation is suppressed, and a display device that is highly reliable and highly flexible is provided.

The above-described embodiments according to the present invention may be optionally combined as long as no contradiction occurs. The display devices described above in the embodiments may have an element added thereto, or deleted therefrom, or may be changed in design optionally by a person of ordinary skill in the art. The methods described above in the embodiments may have a step added thereto, or deleted therefrom, or may be changed in the condition optionally by a person of ordinary skill in the art. Such devices and methods are encompassed in the scope of an embodiment of the present invention as long as including the gist of an embodiment of the present invention.

In this specification, organic EL display devices are mainly described as examples of disclosure. An embodiment of the present invention is applicable to any flat panel display device such as any other self-light emitting display device, a liquid crystal display device, an electronic paper device including an electrophoretic element or the like, etc. An embodiment of the present invention is applicable to small- or medium-sized devices or large-sized devices with no specific limitation on the size.

Even functions and effects that are different from those provided by the above-described embodiments but are obvious from the description of this specification or are easily expectable by a person of ordinary skill in the art are naturally construed as being provided by an embodiment of the present invention.

What is claimed is:

1. A display device, comprising:
a display region including a first region and a second region adjacent to the first region;
display elements arrayed in a first direction and a second direction crossing the first direction in the display region, the display elements including a first display element and a second display element, the first display element located in the first region and the second display element located in the second region; and
transistors, one of the transistors being electrically connected with the first display element via a first wire, another one of the transistors being electrically connected with the second display element via a second wire,
wherein
the first region is a curved region extending in the second direction,
the transistors are located in the second region,
the first display element is connected to the first wire via a first contact hole and the second display element is connected to the second wire via a second contact hole,
locations of the first and second contact holes are located in a same position along a same side of the corresponding first and second display element in the first direction,
and
a distance between the first display element and the one of the transistors is different from another distance between the second display element and the another one of the transistors.

2. The display device according to claim 1, wherein
the transistors include:
a first transistor electrically connected with the first display element, the first transistor being included in the second region;
a second transistor electrically connected with the second display element, the second display element located adjacent to the first display element in the first direction, the second display element being included in the second region; and a third transistor electrically connected with a third display element of the display elements, the third display element located adjacent to the second display element in the first direction, the third display element being included in the second region, and a pitch between the first transistor and the second transistor is equal to a pitch between the second transistor and the third transistor.

3. The display device according to claim 1, wherein the transistors include:

a first transistor electrically connected with the first display element, the first transistor being included in the second region;

a second transistor electrically connected with the second display element, the second display element located adjacent to the first display element in the first direction, the second display element being included in the second region; and a third transistor electrically connected with a third display element of the display elements, the third display element located adjacent to the second display element in the first direction, the third display element being included in the second region, and a pitch between the first transistor and the second transistor is different from a pitch between the second transistor and the third transistor.

4. The display device according to claim 1, wherein the display elements are located as mirror-surface-inverted with respect to a center of the curved region.

5. The display device according to claim 1, wherein the transistors each include:

a semiconductor film;
a gate insulating film;
a gate electrode;
a first insulating film in contact of a first surface of the semiconductor film;

a second surface of the semiconductor film, the first surface being opposite to the second surface in contact with the gate insulating film; and a second insulating film located on the gate electrode.

6. The display device according to claim 1, further comprising a driving circuit.

7. The display device according to claim 1, further comprising scanning signal lines located in the display region.

8. The display device according to claim 1, wherein the display elements are light emitting elements.

9. The display device according to claim 1, further comprising a first barrier film and a second barrier film, wherein the display region is located between the first barrier film and the second barrier film.

10. The display device according to claim 1, further comprising a driving circuit; and a resin substrate or a plastic substrate, wherein the display region and the driving circuit are provided on the resin substrate or the plastic substrate.

11. The display device according to claim 5, wherein the gate insulating film, the first insulating film and the second insulating film are located in the second region.

12. The display device according to claim 6, wherein the driving circuit is located outer to the display region, the display device further includes additional transistors and wires connecting the additional transistors, the additional transistors are located outer to a region where the driving circuit and the curved region overlap each other, and the wires connecting the additional transistors are also located in the region where the driving circuit and the curved region overlap each other.

13. The display device according to claim 11, wherein the gate insulating film, the first insulating film and the second insulating film are formed of an inorganic compound.

14. The display device according to claim 13, wherein the inorganic compound contains at least one of silicon oxide, silicon nitride oxide, silicon oxide nitride and silicon nitride.

15. The display device according to claim 9, wherein the first barrier film and the second barrier film each contain an inorganic compound.

* * * * *